US011989106B2

(12) United States Patent
Lee et al.

(10) Patent No.: US 11,989,106 B2
(45) Date of Patent: May 21, 2024

(54) INLINE BUFFER FOR IN-MEMORY POST PACKAGE REPAIR (PPR)

(71) Applicant: Intel Corporation, Santa Clara, CA (US)

(72) Inventors: Jongwon Lee, Hillsboro, OR (US); Kuljit S. Bains, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 885 days.

(21) Appl. No.: 16/711,243

(22) Filed: Dec. 11, 2019

(65) Prior Publication Data

US 2020/0151070 A1 May 14, 2020

(51) Int. Cl.
| | | |
|---|---|---|
| G06F 11/20 | (2006.01) | |
| G06F 12/0875 | (2016.01) | |
| G06F 12/10 | (2016.01) | |
| G11C 11/4091 | (2006.01) | |
| G11C 29/44 | (2006.01) | |
| G11C 11/408 | (2006.01) | |

(52) U.S. Cl.
CPC ...... *G06F 11/2094* (2013.01); *G06F 12/0875* (2013.01); *G06F 12/10* (2013.01); *G11C 11/4091* (2013.01); *G11C 29/4401* (2013.01); *G06F 2201/82* (2013.01); *G06F 2212/45* (2013.01); *G11C 11/4085* (2013.01)

(58) Field of Classification Search
CPC .................................................. G06F 11/2094
USPC ....................................................... 714/6.13
See application file for complete search history.

(56) References Cited

U.S. PATENT DOCUMENTS

| 6,097,644 A | * | 8/2000 | Shirley | ................ | G11C 29/787 |
| | | | | | 365/225.7 |
| 6,223,248 B1 | * | 4/2001 | Bosshart | ................ | G11C 29/76 |
| | | | | | 711/105 |
| 9,812,222 B2 | | 11/2017 | Kim et al. | | |
| 10,770,164 B1 | * | 9/2020 | Baughen | ................ | G11C 29/38 |
| 11,144,466 B2 | | 10/2021 | Lee et al. | | |
| 2002/0176310 A1 | * | 11/2002 | Hilbert | ................... | G11C 29/70 |
| | | | | | 365/230.06 |

(Continued)

FOREIGN PATENT DOCUMENTS

EP          3370152 B1     12/2019

OTHER PUBLICATIONS

Indian Examination Report for Indian Patent Application No. 202044041621, dated Mar. 8, 2022, 6 pages.

*Primary Examiner* — Chae M Ko
(74) *Attorney, Agent, or Firm* — Compass IP Law PC

(57) ABSTRACT

In a memory system, a memory device has a memory array with multiple rows of memory having logical addresses mapped to their physical addresses and at least one spare row not having a logical address mapped to its physical address. A controller detects a failure of one of the multiple rows of memory ("failure row") and executes a post package repair (PPR) mode. The controller can be internal to the memory device or external to the memory device. The memory device includes an internal scratchpad to allow transfer of data contents from the failure row to the spare row. The controller can map the logical address of the failure row from the physical address of the failure row to the physical address of the spare row, transfer data contents from the failure row to the internal scratchpad, and transfer the data contents from the internal scratchpad to the spare row.

20 Claims, 9 Drawing Sheets

(56) References Cited

U.S. PATENT DOCUMENTS

| | | | | |
|---|---|---|---|---|
| 2003/0009615 A1* | 1/2003 | Hsu | ............... | G11C 29/846 |
| | | | | 711/104 |
| 2009/0290440 A1* | 11/2009 | Nakanishi | ............ | G11C 29/76 |
| | | | | 365/230.08 |
| 2014/0351673 A1* | 11/2014 | Ware | ............... | G11C 29/808 |
| | | | | 714/764 |
| 2015/0135038 A1 | 5/2015 | Wilson et al. | | |
| 2015/0187436 A1* | 7/2015 | Querbach | ............ | G11C 29/72 |
| | | | | 714/720 |
| 2015/0287480 A1* | 10/2015 | Wilson | ............... | G11C 29/04 |
| | | | | 365/96 |
| 2017/0169905 A1* | 6/2017 | Walton | ............... | G06F 3/0656 |
| 2017/0344421 A1 | 11/2017 | Brandl | | |
| 2018/0095821 A1 | 4/2018 | Vogt | | |
| 2018/0330799 A1 | 11/2018 | Yoko | | |
| 2020/0335175 A1* | 10/2020 | Wieduwilt | ............ | G11C 29/24 |

\* cited by examiner

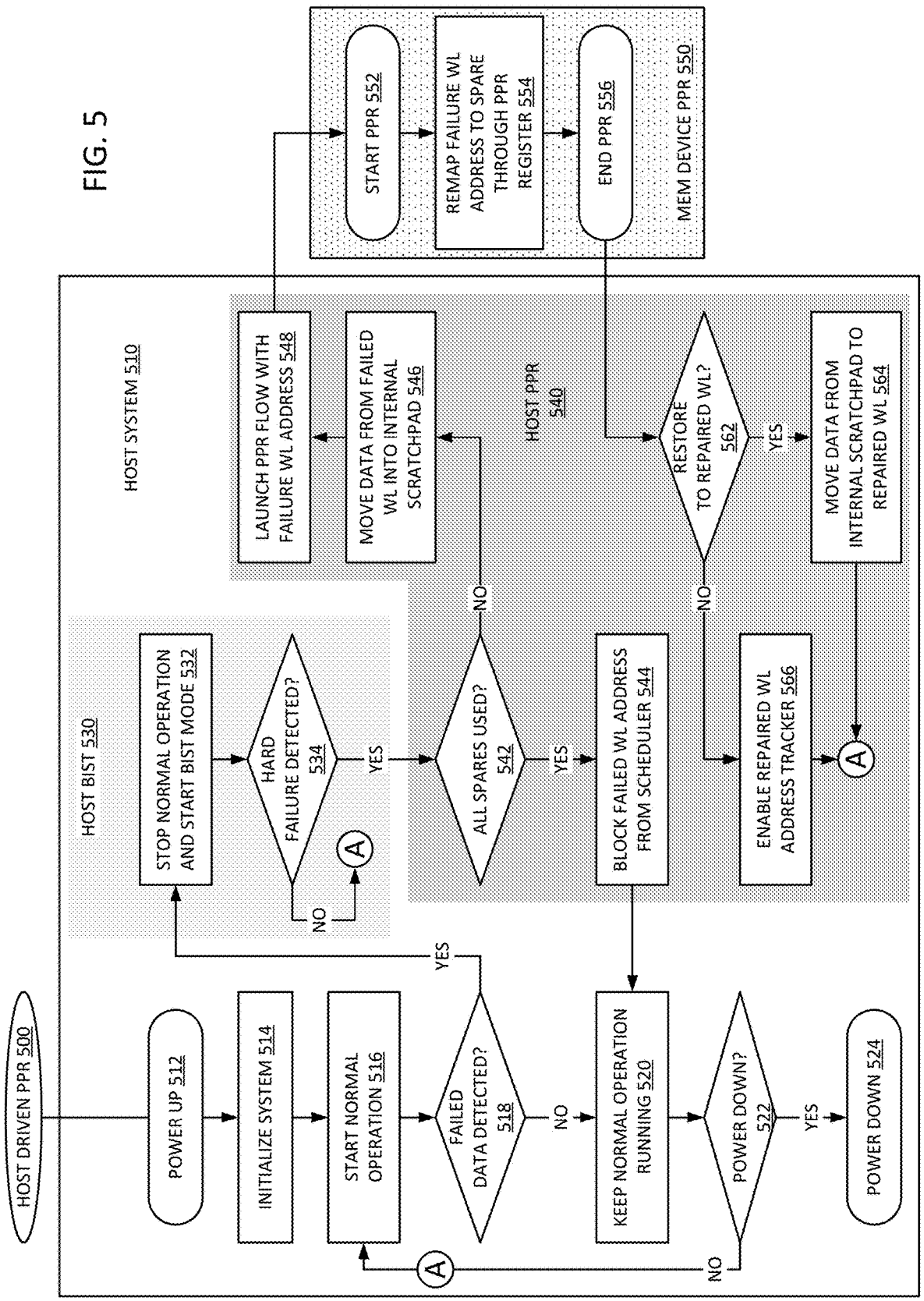

INLINE BUFFER FOR IN-MEMORY POST PACKAGE REPAIR (PPR)

FIELD

Descriptions are generally related to computer memory systems, and more particular descriptions are related to a mechanism for post package repair (PPR).

BACKGROUND

Memory devices experience failures, with rates of failure increasing with smaller geometries and increased densities. RAS (reliability, accessibility, and serviceability) can suffer when errors are frequent. Memory systems commonly include one or more mechanisms to address failures, which can occur due to uncorrectable situations (e.g., a hard failure) or to transient issues (e.g., a soft failure).

One failure mechanism is a post package repair (PPR), where the memory system can detect errors in the memory array and map failed rows to redundant rows. PPR can enable repair without the need for a system reboot. In a soft PPR (sPPR), the failed row of a DRAM (dynamic random access memory) device can be dynamically mapped to a spare row. The mapping of the address prevents the old row from being addressable, which makes it inaccessible, but data can still be stored in the old row.

Implementation of sPPR traditionally involves the memory controller reading all data from the failed row and temporarily storing it within the memory controller. After mapping out the failed row to the spare row, the memory controller needs to write the data back to the memory device to store it in the spare row.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

FIG. 5 is a flow diagram of an example of a process for host driven PPR.

Descriptions of certain details and implementations follow, including non-limiting descriptions of the figures, which may depict some or all examples, and well as other potential implementations.

DETAILED DESCRIPTION

In a memory system, a memory device has a memory array with multiple rows of memory having logical addresses mapped to their physical addresses and at least one spare row not having a logical address mapped to its physical address. The rows having logical address mapped to physical addresses are the active rows of the memory array. The rows that do not have a logical address mapped to a physical address are spare or redundant rows. There can be one or more redundant rows for use in post package repair (PPR) operations, especially soft PPR (sPPR).

The memory system includes a controller that performs an operation to detect a failure of one of the active rows of memory ("failure row") and executes a PPR mode to repair it. In one example, the controller is internal to the memory device, and allows error detection and PPR operation within the memory. In one example, the controller is external to the memory device, and can be, for example, a memory subsystem controller or memory module controller. The external controller can detect the error and cause at least some internal operations to be performed within the memory for PPR operation.

PPR results in the mapping of the failure row to a spare or redundant row. The mapping includes mapping the logical address from the failure row to the spare row. The logical address is the address recognized and used by the host to perform memory access operations. An internal mapping of the logical address to different physical resources does not affect how the host interfaces with the memory device, even though different physical resources can be accessed.

The memory device includes an internal buffer or internal scratchpad memory for temporary storage of failure row contents, which enables local storage of failure row contents to transfer the data contents from the failure row to the spare row. A scratchpad memory can be understood as a temporary storage component or intermediary storage component that stores data for use in an operation, and is typically not accessed beyond the completion of the operation. The scratchpad memory can be referred to as internal because it is within the memory instead of within a controller that detects the error. In one example, the scratchpad memory can be a register device within the memory device. In one example, the scratchpad memory is a prefetch buffer of the memory device. In one example, the scratchpad memory is an additional sense amplifier that can be used as a prefetch buffer or as a PPR transfer buffer.

Figure 1:
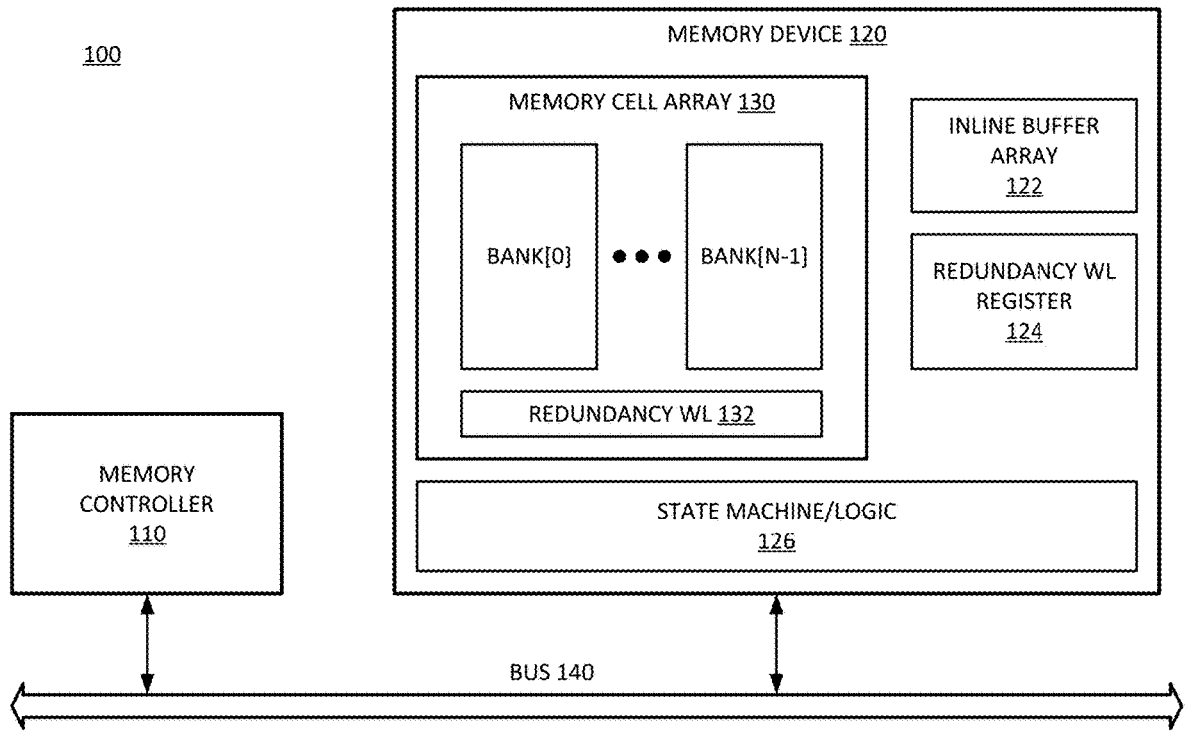
FIG. 1 is a block diagram of an example of a memory system with an internal buffer for post package repair (PPR).

FIG. 1 is a block diagram of an example of a memory system with an internal buffer for post package repair (PPR). System 100 provides an example of a memory system including memory device 120 to store data and memory controller 110 to control access to memory device 120. Memory device 120 couples to memory controller 110 over bus 140.

In one example, memory device 120 includes memory cell array 130 logically organized in multiple banks of memory. System 100 illustrates N banks, Bank[0] to Bank[N−1], where N can be any integer 1 or higher. Typically, N will be a binary number, but is not necessarily binary. A bank of memory refers to a group of columns that are individually addressed, where different banks can use the same row address, or column address, or row and column address, but with a different bank address to access different memory cells. Reference to a row or a column refers generically to an addressing mechanism used to decode address information to one or more specific cells of memory cell array 130. Rows and columns generally refer to an array or matrix layout of memory cell array 130 but does not necessarily mean all cells are physically arranged in linear rows or linear columns.

Memory cell array 130 includes memory cells or bitcells that can store one or more bits per location (e.g., a single bit or multibit cell). In one example, memory cell array 130 represents main memory or volatile memory for system 100. Redundancy WL (wordline) 132 represents one or more spare wordlines that can map out a failed wordline from memory cell array 130. In one example, redundancy WL 132 represents a spare WL limited to a specific bank. The limitation of redundancy WL 132 to a specific bank can enable the performance of a PPR operation on one bank while still enabling another bank to be accessed by memory controller 110.

Memory device 120 includes logic 126 to decode commands from memory controller 110 and manage access to memory cell array 130 in response to the commands. In one example, logic 126 is implemented as a state machine, with state transitions based on various input control signals of the commands. In one example, logic 126 is configured to fetch one or more cachelines or rows of data into inline buffer array 122 to enable the transfer of data from a failed row of memory cell array 130 to a spare row of redundancy wordline 132.

In one example, memory controller 110 is part of a processor device (not shown) of system 100. Memory controller 110 controls access to memory device 120 for system 100, and can be referred to as the host. In one example, memory device 120 represents a memory die or a memory multichip package. In one example, memory device 120 represents a module (e.g., a dual inline memory module (DIMM)) or board on which one or more memory cell arrays 130 are incorporated.

In one example, memory device 120 includes inline buffer array 122. Inline buffer array 122 represents an internal register or internal buffer or other scratchpad memory device that memory device 120 uses to transfer contents of a failed wordline to redundancy WL 132 as part of a PPR procedure or PPR operation. A failed wordline or failed row can alternatively be referred to as a failure row or failure WL, and refers to a row/wordline that has multiple errors. In one example, a row is equivalent to a wordline. In one example, a wordline represents one page of data. The row can be mapped out when the number of errors in the row results in uncorrectable errors.

In one example, memory device 120 includes redundancy WL register 124. Redundancy WL register 124 represents a register memory device 120 can use to map out a failed row to redundancy WL 132. More specifically, redundancy WL register 124 provides a location to store the address of a failed WL to enable mapping the logical address associated with the physical address of the failed WL to the physical address of redundancy WL 132. It could be said that memory 120 can map the logical address associated with a failure WL to a physical address of a spare WL. The mapping out of a failed WL to a spare WL can be performed with a PPR procedure, such as soft PPR (sPPR) or hard PPR (hPPR). In one example, the different transfer mechanism of hPPR enables transfer of the data contents without inline buffer array 122. However, inline buffer array 122 could still be used for a transfer with hPPR when available. The transfer for sPPR may require a temporary storage for data content transfer during operation of the memory device.

However, the data transfer or data migration for implementing sPPR function results in mapping out one address with another address, leaving the original contents in a memory location that is not addressable once it has been mapped out. sPPR provides a quicker but temporary repair for a failed row address, as compared to hPPR which takes longer but is a permanent repair of a row address.

JEDEC (Joint Electron Device Engineering Council) has defined sPPR mode for DDR4 (double data rate (DDR) version 4, JESD79-4, originally published in September 2012 by JEDEC), DDR5 (DDR version 5, currently in discussion by JEDEC), and HBM (high bandwidth memory DRAM, JESD235A, originally published by JEDEC in November 2015). Despite the definition of the sPPR mode, there is little to no use of the feature in industry because there is a lack of space for temporary data storage.

As described herein, the memory device includes an internal temporary storage or internal memory for use in PPR, such as sPPR. The internal temporary storage can be considered a scratchpad memory because it is used temporarily for the transfer of data from one location to another, and the use of the data is complete after the transfer is complete. In one example, the internal memory is implemented with an inline prefetch buffer array. An inline prefetch buffer array can refer to an array of buffer elements that are inline with the data path of the memory devices. The buffer elements can be in the path of the data elements when located between the I/O (input/output) hardware and the memory array. In one example, the inline prefetch buffer can be implemented as another layer of sense amplifier circuits that can be selectable with the typical sense amplifier elements of the data path circuitry. An example is provided in FIG. 4.

In one example, memory device 120 will include a prefetch buffer for prefetch operations, regardless of the application of PPR. Application of the prefetch buffer as a temporary storage to implement inline buffer array 122 for a PPR flow can simplify the PPR flow. The involvement of memory controller 110 can be reduced for PPR flow, especially in that the memory controller does not need to store the data to be transferred, which eliminates the need for memory device 120 and memory controller 110 to exchange the data. Inline buffer array 122 allows all required data to be localized in memory device 120. Thus, memory controller 110 can start the PPR flow, for example, by sending the address of the failed WL after detecting the failure WL.

Figure 2:
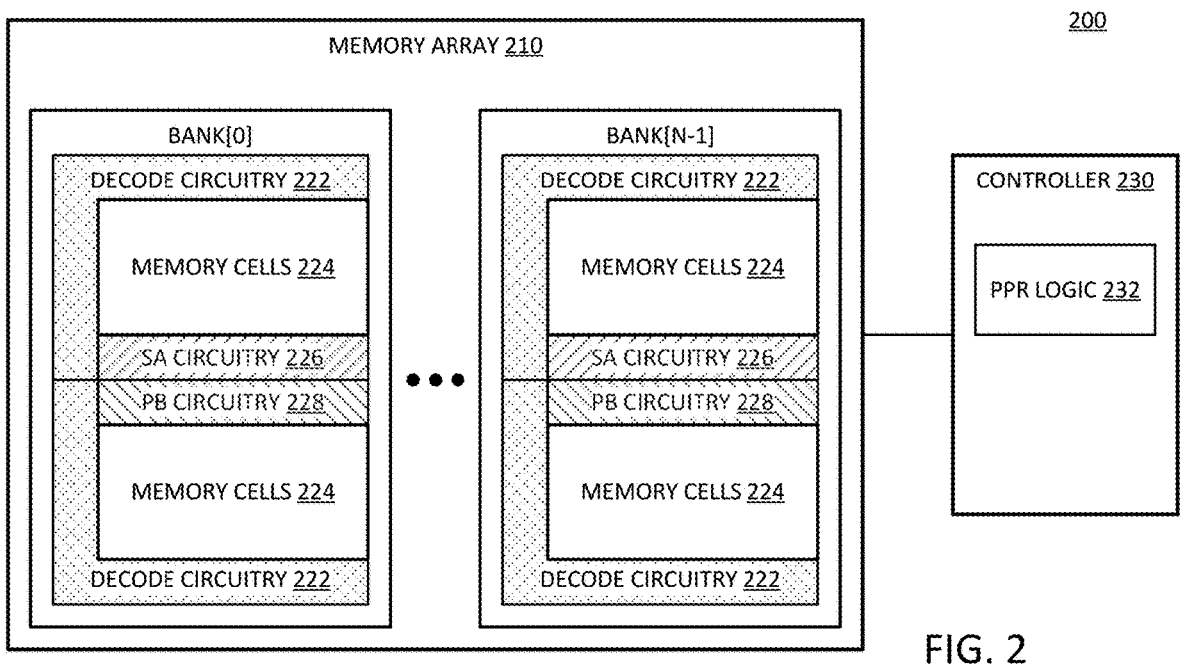
FIG. 2 is a block diagram of an example of a memory device that transfers PPR data through a prefetch buffer.

FIG. 2 is a block diagram of an example of a memory device that transfers PPR data through a prefetch buffer. Device 200 represents elements of a memory device that includes an internal storage for use in a PPR operation or PPR flow. Device 200 provides an example of a memory device in accordance with memory device 120 of FIG. 1. In one example, device 200 represents a single memory device such as a memory die. In one example, device 200 represents a module or device that includes multiple distinct memory dies.

Device 200 includes memory array 210, which illustrates memory resources organized as N banks (Bank[(N−1):0]), where N can be any integer greater than zero. Each bank of memory includes decode circuitry 222 to access memory cells 224. In one example, the memory cells of the banks of memory array 210 can be arranged to have the sense array (SA) circuitry physically between different portions of the memory cells. As illustrated, SA circuitry 226 is between two segments of memory cells 224.

Decode circuitry 222 is illustrated above and to the side of memory cells 224 to represent row decode circuitry and column decode circuitry. The location of the decode circuitry is not necessarily to the "outside" of the memory cell array. Decode circuitry 222 addresses specific portions of memory cells 224 in accordance with an address of a memory access command. Decode circuitry 222 is illustrated adjacent to SA circuitry 226 to represent the fact that the sense amplifiers can be selectable based on address, for example, selecting only a portion of the bits.

In one example, device 200 includes prefetch buffer (PB) circuitry 228. PB circuitry 228 is illustrated within memory array 210 as an inline temporary memory component. PB circuitry 228 is illustrated between the two segments of memory cells 224 adjacent to SA circuitry 226 to represent an example where PB circuitry 228 is another layer of sense amplifier circuitry. In one example, PB circuitry 228 can be addressed similar to SA circuitry 226, and thus, decode circuitry 222 is illustrated adjacent to the PB circuitry to represent the selectability of the prefetch buffer.

In one example, the prefetch buffer of PB circuitry 228 provides a temporal space that is the same size as a page or a multiple of or a page inside the memory device. Thus, in one example, PB circuitry 228 can hold a page size or a row size amount of data. Thus, PB circuitry 228 can be used as a scratchpad memory device.

Controller 230 represents a controller or control logic of device 200. Controller 230 represents a controller on the memory device. It will be understood that controller 230 is separate from the host controller or memory controller that is part of the host. In an example where device 200 represents a single memory die, controller 230 can represent the logic on the memory die that enables the memory to control driver circuitry including decode circuitry 222. Controller 230 can generate operations within device 200 to service a memory access request associated with a memory access command. In an example where device 200 represents a memory with multiple memory dies, controller 230 can represent a controller on the module as well as control circuitry within the individual memory dies.

In one example, if a memory controller (not specifically shown) triggers an sPPR flow, controller 230 will move the data from memory cells of the failed address WL into PB circuitry 228. In one example, after the data is moved into PB circuitry 228, controller 230 (which can be in response to one or more commands from the host or the memory controller) can initiate a repair flow or PPR operation. In one example, PB circuitry 228 is localized to a single bank of memory. Thus, device 200 can include a scratchpad memory localized to each bank of memory array 210.

In one example, controller 230 implements the PPR operation based on PPR logic 232. PPR logic 232 represents logic in controller 230 to enable device 200 to perform PPR operations to repair errors. In one example, PPR logic 232 includes one or more PPR registers. The registers enable controller 230 to store the address information for mapping failed rows to redundant rows. The redundant rows or spare rows are not specifically illustrated in device 200. It will be understood that the spare rows can be part of memory cells 224. Initially the rows will not be addressed by controller 230. After a PPR operation, the spare row will be addressed for access instead of a failed row.

When controller 230 completes PPR operations, such as completion of an sPPR flow, controller 230 can restore the data from PB circuitry 228 to the spare row. In one example, the restoration of the data occurs in response to one or more commands from the host. In one example, a prefetch buffer typically includes data from multiple pages. In one example, whether the prefetch buffer typically stores data from multiple pages or from only one page, when used for PPR, the prefetch buffer stores only one page that will be transferred from a failed row to a spare row.

In one example, the host can use PB circuitry 228 for reading data from a target write address prior to writing new data to the address. After mapping out the failed WL with a spare WL, when a host issues a memory access command to the logical address that was associated with the failed wordline, controller 230 can direct the access command to the spare WL. Eventually, the host controller can use the spare WL as a normal WL until power-down, given that an sPPR register will lose data after power-down. Thus, sPPR may need to be followed up by an hPPR routine to perform a more permanent mapping out of the failed WL.

Figure 3:
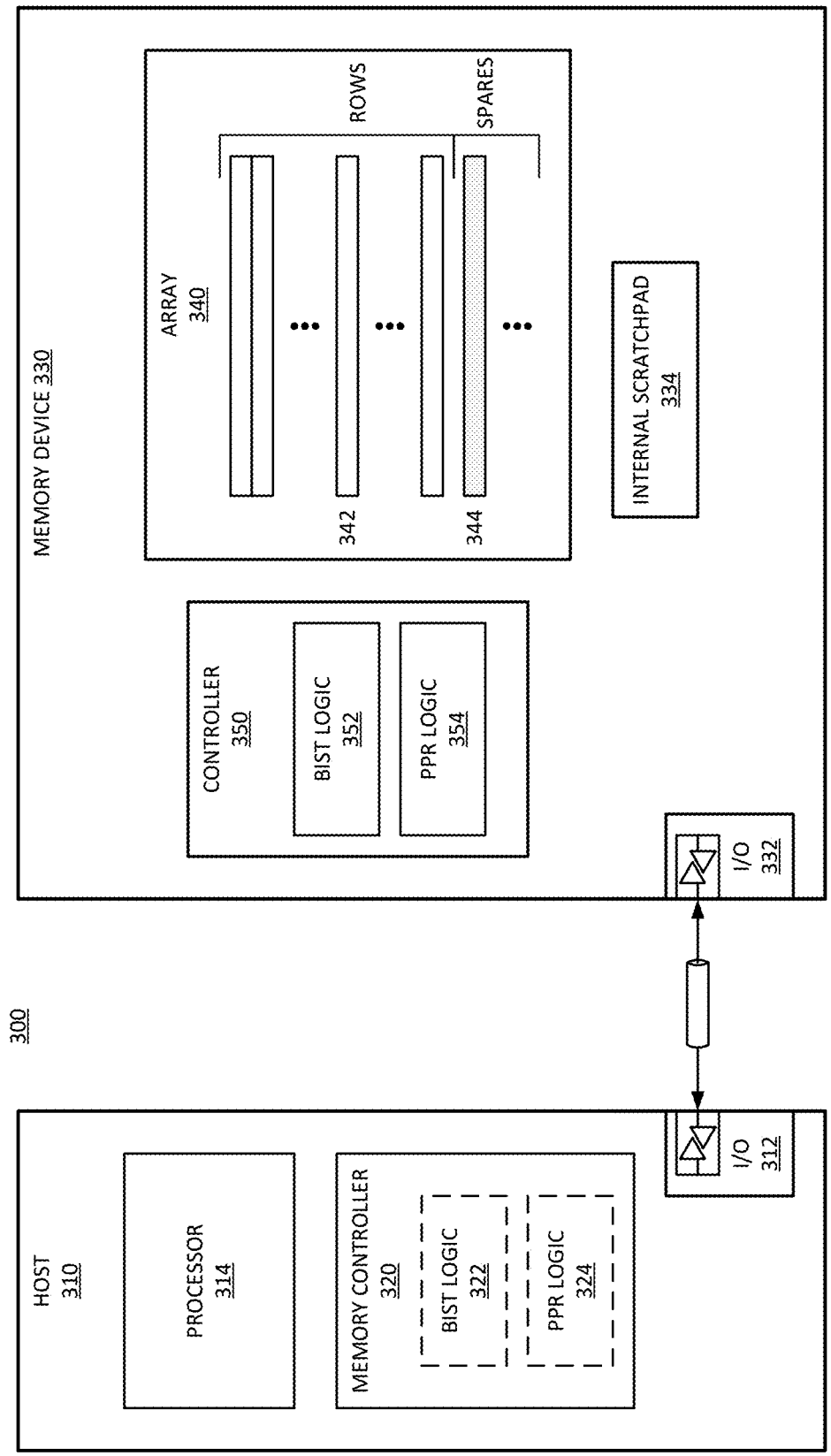
FIG. 3 is a block diagram of an example of a memory system with a memory array having spare rows and an internal scratchpad for PPR.

FIG. 3 is a block diagram of an example of a memory system with a memory array having spare rows and an internal scratchpad for PPR. System 300 provides one example of a system in accordance with system 100 of FIG. 1. System 300 includes host 310, which represents the hardware platform in which the memory device is incorporated, and includes a processor and access control logic to control access to the memory device.

Host 310 includes processor 314 to execute control logic for system 300, which can be or include a host operating system (OS). Host 310 includes memory controller 320 to control access to memory device 330. In one example, memory controller 320 includes PPR logic 324, which can include host-side logic to detect failed wordlines in memory and trigger memory device 330 to perform repair operations.

Host 310 includes I/O 312, which can include one or more signal lines or one or more buses to interface with memory device 320. I/O 312 can include hardware interfaces including drivers or receivers or drivers and receivers to exchange information over one or more signal lines. Memory device 330 includes I/O 332, which enables the memory device to interface to the signal lines to which host 310 couples to the memory.

Memory device 330 includes array 340, which represents one or more arrays of memory cells to store data in system 300. Array 340 can be divided into subarrays. An array or a subarray can refer to separately addressable units. An array can be divided based on address information received from host 310, and a subarray provides a smaller unit within memory device 330 based on the driver architecture.

Array 340 illustrates rows of memory. In one example, a row is a wordline. It will be understood that memory device arrays are typically separated into global wordlines (GWL) or master wordlines (MWL) as well as local wordlines (LWL) or sub wordlines (SWL). Depending on the architecture, an addressable "row" of memory may or may not be equivalent to a physical wordline. However, there is a relationship between a row of memory and one or more physical wordlines or portions of wordlines that are addressed together. For purposes of the description, a row can be considered a unit that would be addressed in a command, which typically corresponds to a wordline. It will be understood that variations can be made depending on the system architecture. In one example, an access command (e.g., a write command or a read command) will trigger memory device 330 to write or read a page of memory. A page of memory can refer to an entire wordline, where the data of a whole wordline or a portion of the wordline may be accessed in response to an access command.

In one example, array 340 includes spare row 344. Spare rows can be available for temporary mapping out of failed rows (e.g., through sPPR) or permanent mapping out of failed row (e.g., through hPPR). In one example, array 340 has fewer spare rows available for sPPR than the total number of spare rows in array 340.

Memory device 330 includes controller 350, which represents a controller or control logic within the memory device, which is separate from memory controller 320. In one example, controller 350 includes BIST (built-in self-test) 352. BIST 352 enables the testing of rows in array 340 to detect errors. In one example, memory device 330 includes hardware logic to respond to a BIST test controlled by host 310. Host 310 includes BIST logic 322 in memory controller 320. In one example, memory controller 320 includes logic to execute a self-test to detect errors in array 340, where host 310 controls the test by accessing certain locations in the memory.

Controller 350 includes PPR logic 354, which represents control logic to enable memory device 330 to perform PPR operations. In an implementation of a host-controlled PPR, the PPR operations performed by PPR logic 354 can be limited to remapping physical addresses for failed row 342 to spare row 344. In an implementation of an autonomous PPR, PPR logic 354 can additionally transfer data contents of failed row 342 to spare row 344.

Memory device 330 includes internal scratchpad 334, which represents an internal temporary storage in accordance with any example herein. In one example, internal scratchpad 334 is implemented as a prefetch buffer to store a page of data to transfer from a failed row to a spare row. In one example, internal scratchpad 334 represents a register device used to perform PPR, to temporarily store the data contents of a failed row to enable PPR.

Consider an example where memory controller 320 executes a BIST test and detects a failure of row 342. In one example, in response to detection of the failure, controller 350 stores the address of failed row 342 in a register (not specifically shown) that stores the mapped out address. In one example, controller 350 reads the contents of row 342 into internal scratchpad 334 and then performs a PPR operation (e.g., sPPR). After completing the PPR operation, controller 350 can store the contents of the failed row from internal scratchpad 334 into spare row 344, and access command directed to the logical address of failed row 342 will be mapped to the physical address of spare row 344 instead of to the physical address of failed row 342.

Figure 4:
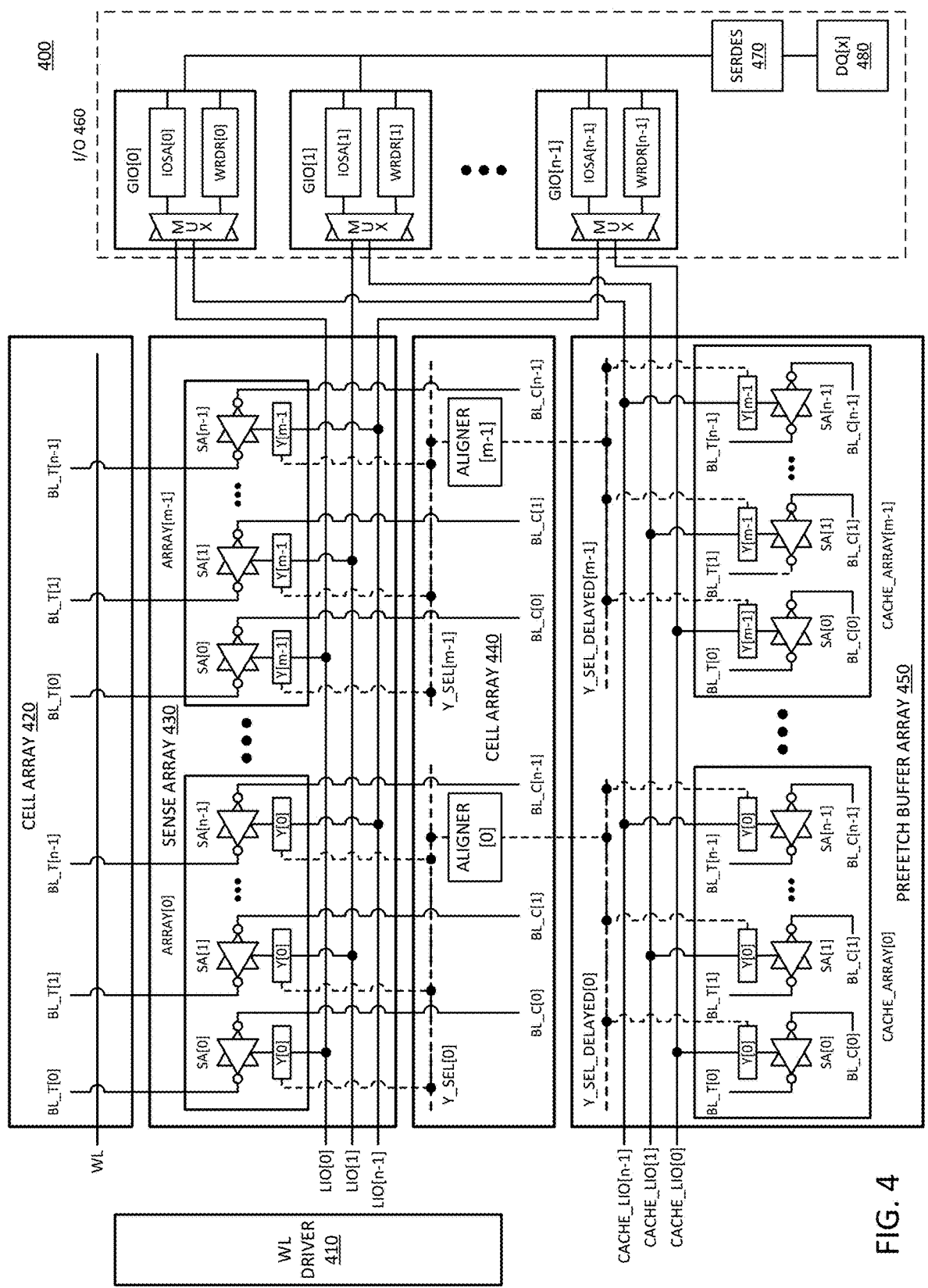
FIG. 4 is a block diagram of an example of a memory device with a prefetch buffer array.

FIG. 4 is a block diagram of an example of a memory device with a prefetch buffer array. Circuit 400 represents elements of a memory device that includes an internal scratchpad memory. The memory device provides an example that can be implemented in accordance with any description of a memory device herein. Circuit 400 more specifically illustrates a device with a prefetch buffer to operate as an inline scratchpad memory device.

Circuit 400 includes WL driver 410 to drive wordlines of the memory array of circuit 400. In one example, circuit 400 includes bitcells in a first cell array 420 and a second cell array 440. Circuit 400 includes sense array 430, which can be referred to as a bitline (BL) sense amplifier (BLSA) array. In one example, circuit 400 includes prefetch buffer (PB) array 450 as a buffer array for prefetch of data. In one example, PB array 450 is primarily used as a buffer to prefetch data for portions of cell arrays 420, 440 that are the target or write operations. In one example, cell arrays 420, 440 can be implemented as DRAM cell arrays. In one example, PB array 450 can be implemented as arrays of SRAM (synchronous random access memory) cells.

As illustrated, sense array 430 includes M arrays, Array [(m−1):0]. Each array can include N sense amplifiers SA[(n−1):0]. The N sense amplifiers can be coupled, respectively, to N bitline signals BL_T[(m−1):0)] on one side and N bitline complement signals BL_C[(m−1):0)] on the other side. In one example, the M arrays are controlled by M column select signals Y_SEL[(m−1):0], with Y_SEL[0] to control access to Array[0], Y_SEL[1] to control access to Array[1], and so forth.

In one example, PB array 450 is structured similarly to sense array 430, with M cache arrays, Cache_Array[(m−1):0]. Each cache array can include N sense amplifiers SA[(n−1):0]. The N sense amplifiers can be coupled, respectively, to N bitline signals BL_T[(m−1):0)] on one side and N bitline complement signals BL_C[(m−1):0)] on the other side. In one example, the M arrays are controlled by M column select signals Y_SEL[(m−1):0], with Y_SEL[0] to control access to Array[0], Y_SEL[1] to control access to Array[1], and so forth. In one example, the M column select lines for PB array 450 are coupled to the column select lines that control the sense amplifiers of sense array 430. The column select lines in PB array 450 are coupled through aligner circuits, with aligner[0] for Y_SEL[0], aligner[1] for Y_SEL[1], and so forth. The aligners can offset the column select signal relative to the column select for sense array 430, as shown by corresponding Y_SEL_DELAYED signals illustrated in PB array 450 for each Y_SEL signal of sense array 430.

Circuit 400 includes I/O circuitry 460. I/O circuitry 460 can include N global I/O (GIO) circuits GIO[(n−1):0]. GIO circuits can include both input and output multiplexing (MUX), with I/O line sense amplifiers (IOSA) for read operations and write drivers (WRDR) for a write operation. In one example, each GIO circuit connects to a pair of signal lines, one from sense array 430 and one from PB array 450. Circuit 400 can be configured through addressing to either couple to the sense array or the PB array.

I/O circuitry 460 includes serializer/deserializer circuit (SERDES) 470. SERDES 470 can serialize outgoing data for transmission over multiple unit intervals (UI) of transmission or deserialize incoming data to store in the cell arrays. I/O circuitry 460 includes DQ[x] 480, which represents a DQ interface for a memory device of circuit 400. DQ[x] 480 can be, for example, a data pad to couple to a data signal line of a data bus.

For the simplified cell array architecture illustrated in circuit 400, a memory device receives a specific address associated with a memory access command. As one example, consider that the address is for a wordline in cell array 420, labeled WL. Alternatively, the command could be addressed to a wordline in cell array 440.

For the row access, WL driver 410 opens the WL cell data connected to WL will be connected to sense array 430. The SA circuits amplify and keep the data, converting the analog signal read from a bitcell into a digital output. After a specified timing specification (e.g., row address strobe (RAS) to column address strobe (CAS) delay (tRCD)), the memory controller can start a column access for a corresponding read or write command. Based on the data packet size, specification per access (N in the example illustrated), one of the column selection signals Y_SEL[(m−1):0] connects N SA circuits to local I/O signals (LIO[(n−1):0]). The local I/O signals are LIO for sense array 430 and CACHE_LIO for PB array 450. The N LIOs are connected to N pairs of I/O line sense amplifiers (IOSA) and write drivers (WRDR).

In Write mode, after the controller opens the WL following the row access described above, circuit 400 can receive a data packet from the memory controller through DQ[x] 480. SERDES 470 assigns and drives the data to the WRDR connected with each GIO of I/O circuitry 460. The WRDR writes the data into sense elements of sense array 430 and PB array 450 based on connection by a Y_SEL signal. The sense array, in turn, can write the data into the cells through the open WL.

In Read mode, similarly, after WL is opened by the controller, cell data is amplified and kept in sense array 430. Circuit 400 receives a read command from the controller. In response to the command, circuit 400 opens a Y_SEL signal and connects the sense array 430 into N LIOs. Sense array 430 writes the data into N IOSAs connected to N corresponding LIOs. Each IOSA amplifies and drives the data into SERDES 470 through N GIO circuits. SERDES 470 drives the data out to the memory controller through DQ[x] 480.

In one example, PB array 450 can operate as a scratchpad memory or temporary storage for PPR operation in accordance with any example provided. In one example, PB array 450 is controlled in sync with normal column selection signals, and can be read and written through conventional IOSA/WRDR circuits. For example, for a corresponding copying function in an sPPR flow, a failed WL is activated and the cell data is amplified by a sense array. The data can then be transferred to each IOSA/WRDR pair. In one example, the IOSA amplifies the data and the WRDR writes the data into the same column-addressed PB array through the bidirectional muxes or multiplexers "MUX". After all the copying is finished and remapping the failed row address to a redundancy WL by using redundancy WL registers, the data can be written into the cells connected to the repaired WL similar to the write flow described above.

FIG. 5 is a flow diagram of an example of a process for host driven PPR. Process 500 for a host driven PPR process can be an example of a process for performing a repair procedure using an internal temporary memory to transfer data from a failed WL to a redundant WL in accordance with any description herein.

Process 500 illustrates different operations for different portions of a computing system. In one example, host system 510 includes host BIST 530 and host PPR 540. Host BIST 530 represents a test to identify a failed WL. Host PPR 540 represents repair procedure operations in host system 510. Memory device PPR 550 represents a repair procedure operation in a memory device coupled to host system 510.

In one example, host system 510 powers up, block 512. The system initializes, block 514, and starts normal operation, block 516. If host system 510 does not detect failed data, block 518 NO branch, the host system keeps normal operation running, block 520. If the host system is supposed to power down (e.g., in response to a power down trigger), block 522 YES branch, the system powers down, block 524. If the system is not supposed to power down, block 522 NO branch, the system continues with normal operation, block 516. The system can be said to "start" normal operation again because the system will again check for failed data during normal operation.

In one example, if host system 510 detects failed data, block 518 YES branch, host system 510 stops normal operation and starts a BIST mode, block 532. The types of errors that can occur are soft errors that can be corrected by attempting the memory access again and hard errors are not correctable but will continue to show up for the failed wordline. In one example, if the error detected is not a hard failure, block 534 NO branch, the system can exit host BIST 530 and return to normal operation, block 516.

In one example, if the detected failure indicates a hard failure, block 534 YES branch, in one example, the host will identify the address of the failure WL to send to the memory device. In one example, there are a limited number of spare or redundant WLs the system has available to map out hard failures with the PPR operation. If all spares are used, block 542 YES branch, in one example, host system 510 blocks the failed WL address from the memory controller scheduler, block 544. Blocking the address prevents the host from directing access operations to the address, and the system can again return to keeping normal operation running, block 520.

If all the spares are used, block 542 NO branch, in one example, the system moves the data from the failed WL into an internal scratchpad, block 546. In one example, the internal memory is a prefetch buffer that is page-size-matched with the failed WL. The movement of the data can occur in accordance with any description herein. In one example, with a host-driven PPR, host PPR 540 generates commands to cause the movement of the data within the memory device. In one example, host PPR 540 launches a PPR flow within the memory device with the failure WL address, block 548.

Memory device PPR 550 represents the operations of the memory device. The memory device starts its PPR operation, block 552. In one example, the memory device through its controller can remap the failure WL address to an available spare WL by way of a PPR register, block 554. The PPR register enables the memory device to receive an address for a WL with an uncorrectable error to enable the repair. The memory device can end the PPR operation, block 556, and return control to host system 510.

In one example, the memory device will provide the status update to the flow control of host PPR 540 of host system 510. The system can optionally restore a repaired WL. The repaired WL refers to the WL that has been mapped out to a spare physical address. Restoration can refer to the transfer of contents from the failure WL to the repaired WL.

In one example, if host PPR 540 is to restore the repaired WL, block 562 YES branch, in one example, the host drives the move of the data from an internal scratchpad within the memory device to the repaired WL, block 564, which returns the operation to the normal operation start, block 516.

If the system is not to restore the data to the repaired WL, block 562 NO branch, in one example, the system can enable the repaired WL address tracker, block 566. In one example, the enabling of the repaired WL address tracker includes the host performing certain tasks.

If there is a Write into a cell of a repaired address WL, the host controller can activate the WL of the address and write the data into the addressed cells. After the writing, the host controller should read the written data from the cells until power down when all sPPR registers will lose their written values. If there is a read required from the repaired address before writing new data into the address, in one example, the host controller reads the data from the prefetched buffer array until new data is written into the addressed cells. The host controller can continue to perform these tasks until all data in the prefetched buffer array is written into the cells of the repaired WL. In one example, the host controller will disable the repaired WL address tracker after all data is written.

For a mapped out WL, the host controller can use the redundant WL as a normal WL during operation until power-down, since a sPPR register will lose data after power-down. Whether moving data, block 564 or not moving data, block 566, the system can return to normal operation, block 516.

Figure 6A:
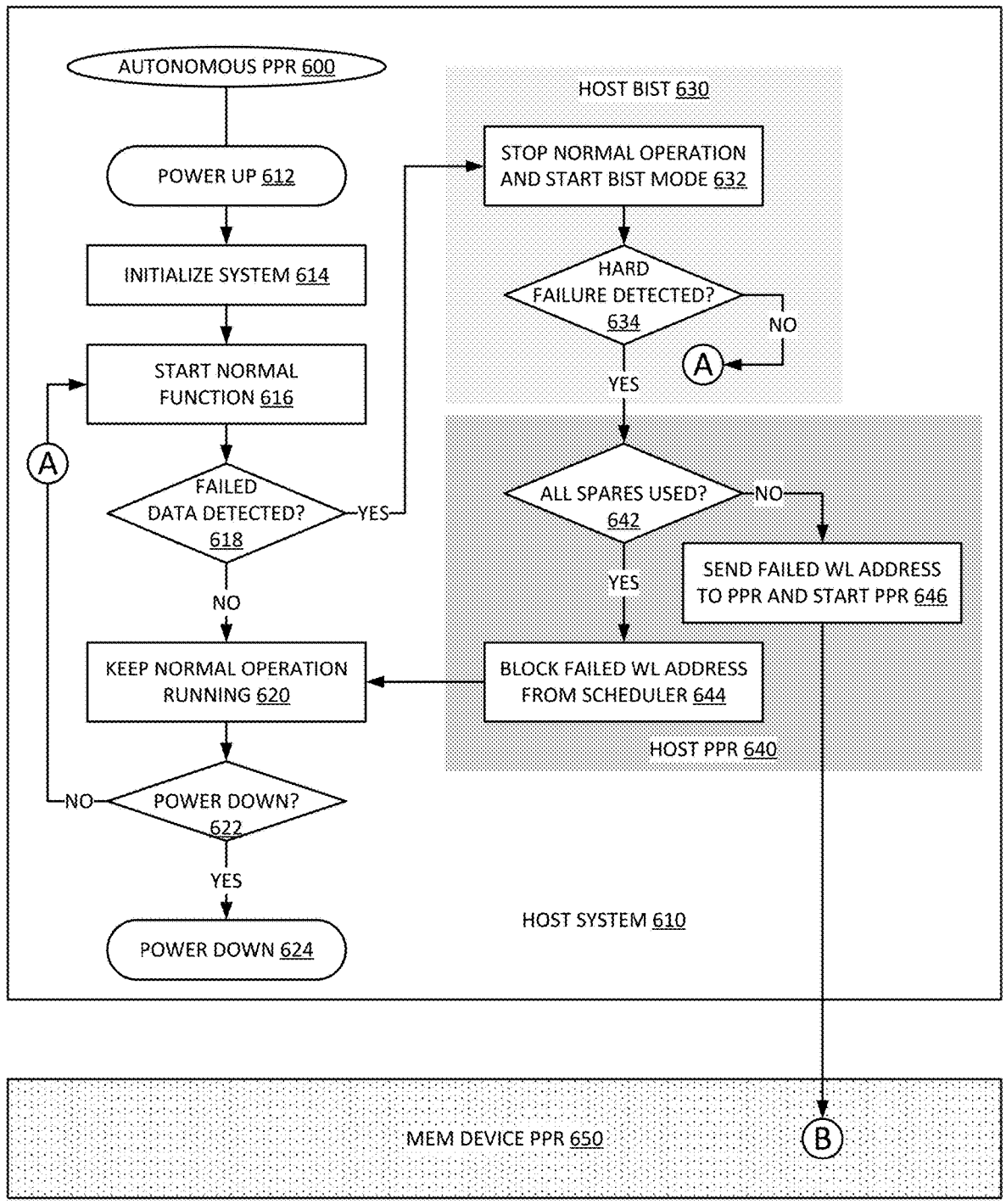
FIGS. 6A-6B represent a flow diagram of an example of a process for memory device autonomous PPR.
Figure 6B:
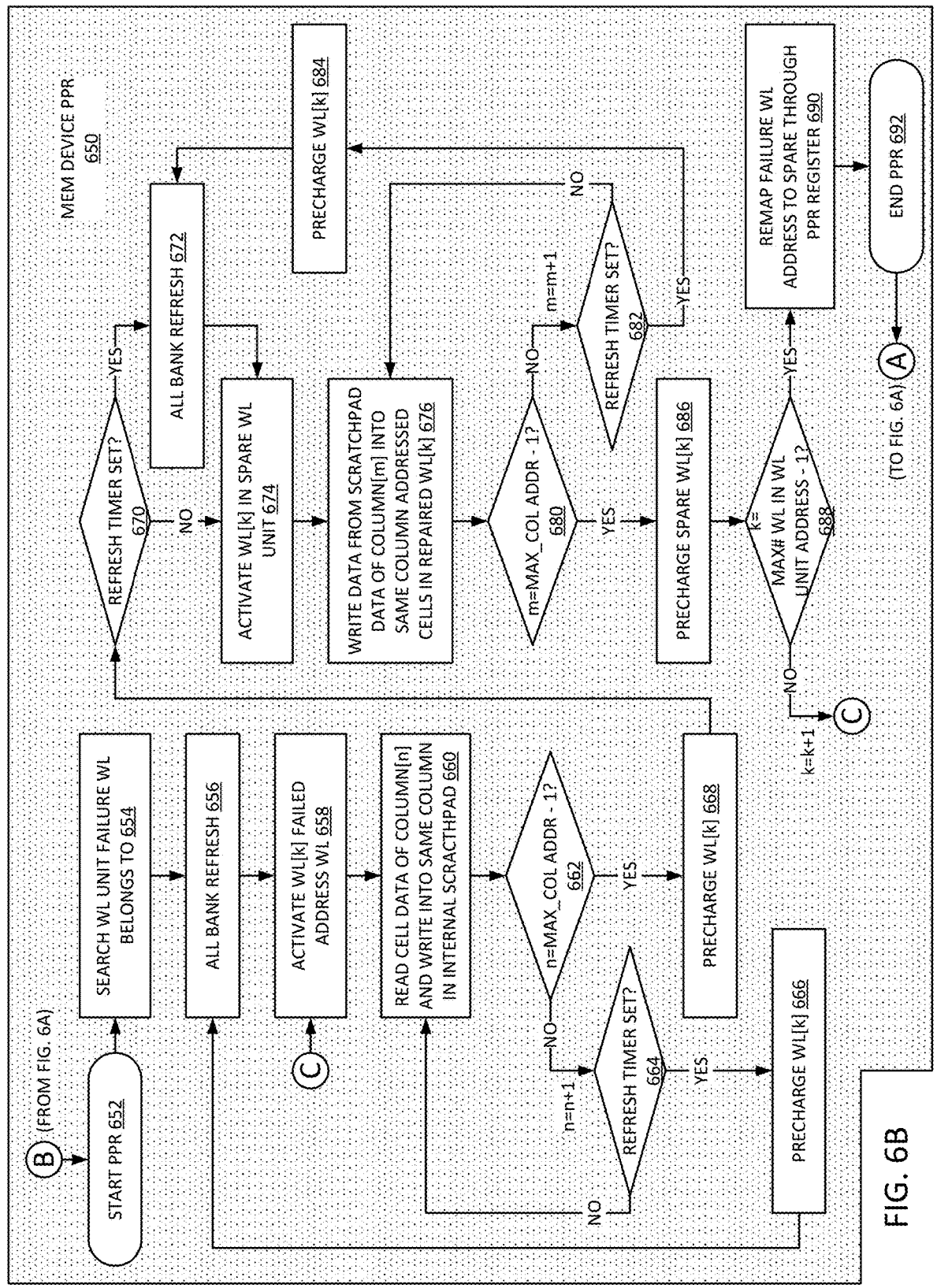

FIGS. 6A-6B represent a flow diagram of an example of a process for memory device autonomous PPR. Referring to FIG. 6A, process 600 for an autonomous PPR process can be an example of a process for performing a repair procedure using an internal temporary memory to transfer data from a failed WL to a redundant WL in accordance with any description herein. With an autonomous PPR process, the memory device can internally transfer data contents from a failure row to an internal scratchpad memory and from the internal scratchpad memory to a repaired row. The memory device can transfer contents to and from the internal scratchpad memory without commands from the host controller to cause the transfer of contents; rather, the memory device can control the transfer of data contents of the failure row.

Process 600 illustrates different operations for different portions of a computing system. In one example, host system 610 includes host BIST 630 and host PPR 640. Host BIST 630 represents a test to identify a failed WL. Host PPR 640 represents repair procedure operations in host system 610. Memory device PPR 650 represents a repair procedure operation in a memory device coupled to host system 610.

In one example, host system 610 powers up, block 612. The system initializes, block 614, and starts normal operation or normal function, block 616. If host system 610 does not detect failed data, block 618 NO branch, the host system keeps normal operation running, block 620. If the host system is supposed to power down (e.g., in response to a power down trigger), block 622 YES branch, the system powers down, block 624. If the system is not supposed to power down, block 622 NO branch, the system continues with normal operation, block 616.

In one example, if host system 610 detects failed data, block 618 YES branch, host system 610 stops normal operation and starts a BIST mode, block 632. The BIST mode can enable the host controller to repair the failure. The types of errors that can occur are soft errors that can be corrected by attempting the memory access again and hard errors are not correctable but will continue to show up for the failed wordline. In one example, if the error detected is not a hard failure, block 634 NO branch, the system can exit host BIST 630 and return to normal operation, block 616.

In one example, if the detected failure indicates a hard failure, block 634 YES branch, in one example, the host will identify the address of the failure WL to send to the memory device. In one example, there are a limited number of spare or redundant WLs the system has available to map out hard failures with the PPR operation. If all spares are used, block 642 YES branch, in one example, host system 610 blocks the failed WL address from the memory controller scheduler, block 644. Blocking the address prevents the host from directing access operations to the address, and the system can again return to keeping normal operation running, block 620. In one example, if all spares are not used, block 642 NO branch, the host can send the failed WL address to the memory device PPR and start the PPR operation, block 646.

Process 600 continues at FIG. 6B after memory device PPR 650 is initiated and the memory device receives the address information of the failure WL. The memory device starts PPR, block 652. In one example, the memory device searches a unit the failure WL belongs to, block 654. The unit refers to a group of WLs detected to have failed, and a repair procedure can occur for all failure WLs detected.

In one example, the memory device performs an all bank refresh, block 656, and activates WL[k] the failure WL address, block 658. WL[k] indicates an address for the failure WL. In one example, the memory device reads the cell data of column[n] and writes the data for the column into the same column of the internal scratchpad, block 660. If n=MAX_COL_ADDR-1, then the memory device precharges WL[k], block 668 and continues to determine if the refresh timer is set. In one example, MAX_COL_ADDR refers to a maximum address of the columns.

If the maximum column has not been reached, block 662 NO branch, in one example, the memory device increments n and determines whether the refresh timer is set, block 664. If the refresh timer is not set, block 664 NO branch, the memory device will repeat the read of the next column and write it into the scratchpad, 660. If the refresh timer is set, block 664 YES branch, in one example, the memory device precharges WL[k], block 666, and returns to perform an all bank refresh, block 656. The return to 656 enables the memory device to maintain current on refresh operations. The operations to copy column data over is the process of moving the data connected with a failure WL to an unread redundant WL through an internal scratchpad memory (such as a prefetch buffer array).

When n has reached the maximum column address, block 662 YES branch, the data will have been finished being moved. After moving all data, the memory device can update the redundant WL control register with the failed address and exit the sPPR mode. In one example, after completing the move of the data, the memory device can check to see if the refresh timer is set. If the refresh timer is set, block 670 YES branch, the memory device can perform refresh operations, block 672. If the refresh timer is not set, block 670 NO branch, in one example, the memory device activates WL[k] in the spare WL unit, block 674.

In one example, the memory device writes data from the scratchpad data of column[n] into the same column addressed cells in the repaired WL[k], block 676. These operations move the data from the scratchpad into the WL that has been mapped to the logical address of the failure WL. The memory device can continue to transfer data until all data has been transferred.

Thus, m has not reached the maximum column number, block 680 NO branch, in one example, the memory device increments m and determines whether the refresh timer is set, block 682. If the refresh timer is not set, block 682 NO branch, the memory device will repeat the read of the next column and write it into the scratchpad, block 676. If the refresh timer is set, block 682 YES branch, in one example, the memory device precharges WL[k], block 684, and performs an all bank refresh, block 672.

When m has reached the maximum column number, block 680 YES branch, in one example, the memory device precharges the spare WL[k], which now holds the data and is the wordline that needs to be monitored for refresh, block 686. In one example, if k has not reached the maximum number of WLs in the WL unit address, block 688 NO branch, in one example, the memory device increments k to go to the next wordline, and returns to block 658 to repeat the repair operation for other failure WL detected.

In one example, if k has reached the maximum number of WLs in the WL unit, block 688 YES branch, the memory device remaps the failure WL address to the spare through the PPR register, block 690. The PPR register refers to a register that the controller can use to redirect requests for a logical address of a WL from a physical address of a failure WL to a physical address of the spare WL. The memory device can then end the PPR, block 692, and return to the normal operation of the host, block 616 of FIG. 6A.

In one example, the host controller can include an additional feature of saving a failure WL address in the controller and using hPPR when the system is not busy. sPPR is quicker to execute than hPPR and can be performed during runtime. However, the remapping is temporary since the remapping will disappear when the memory power is turned off and power is interrupted to the register, rendering its contents indeterminate. If the host controller performs hPPR on the failed WL before turning off the memory power rail, the failed WL can be repaired to a normal WL permanently.

Figure 7:
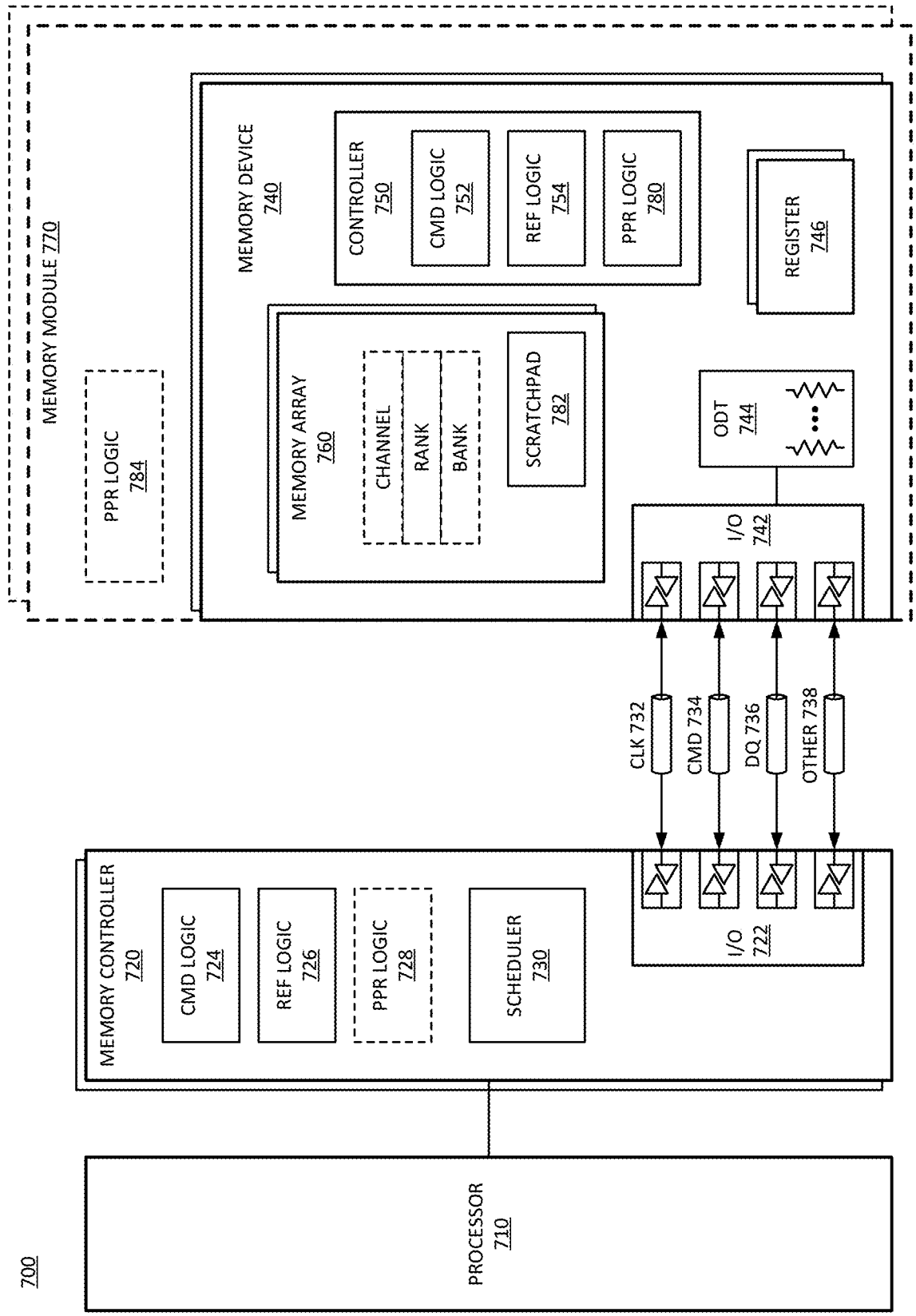
FIG. 7 is a block diagram of an example of a memory subsystem in which PPR in a memory with an internal scratchpad memory can be implemented.

FIG. 7 is a block diagram of an example of a memory subsystem in which PPR in a memory with an internal scratchpad memory can be implemented. System 700 includes a processor and elements of a memory subsystem in a computing device. System 700 provides an example of a system in accordance with system 100 or system 300.

In one example, system 700 includes an internal scratchpad memory 782 in memory array 760 or otherwise in memory device 740. Scratchpad 782 enables memory device 740 to perform PPR with internal storage without having to move data contents of a failure row to memory controller 720. In one example, memory controller 720 includes PPR logic (not specifically shown) to perform PPR operations to support remapping a failure row with scratchpad 782. In one example, controller 750 of memory device 740 includes PPR logic to execute operations to remap a failure row, moving the data contents of the failure row to the new row with scratchpad 782 in accordance with any example herein.

PPR logic 780 represents logic within memory device 740 to perform PPR operations inside the memory device in accordance with any example herein. PPR logic 728 represents logic within memory controller 720 to perform host side PPR operations in accordance with any example herein. PPR logic 784 represents logic that can be implemented in a module controller (not specifically shown), for example, an RCD (registered clock driver) or other controller on the module to perform PPR operations for multiple memory device dies.

Processor 710 represents a processing unit of a computing platform that may execute an operating system (OS) and applications, which can collectively be referred to as the host or the user of the memory. The OS and applications execute operations that result in memory accesses. Processor 710 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processer via a bus (e.g., PCI express), or a combination. System 700 can be implemented as an SOC (system on a chip), or be implemented with standalone components.

Reference to memory devices can apply to different memory types. Memory devices often refers to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR4 (DDR (double data rate) version 4, JESD79-4, originally published in September 2012 by JEDEC (Joint Electron Device Engineering Council)), LPDDR4 (low power DDR version 4, JESD209-4, originally published by JEDEC in August 2014), WIO2 (Wide I/O 2 (WideIO2), JESD229-2, originally published by JEDEC in August 2014), HBM (high bandwidth memory DRAM, JESD235A, originally published by JEDEC in November 2015), DDR5 (DDR version 5, currently in discussion by JEDEC), LPDDR5 (LPDDR version 5, JESD209-5, originally published by JEDEC in February 2019), HBM2 ((HBM version 2), currently in discussion by JEDEC), or others or combinations of memory technologies, and technologies based on derivatives or extensions of such specifications.

In addition to, or alternatively to, volatile memory, in one example, reference to memory devices can refer to a nonvolatile memory device whose state is determinate even if power is interrupted to the device. In one example, the nonvolatile memory device is a block addressable memory device, such as NAND or NOR technologies. Thus, a memory device can also include a future generation nonvolatile devices, such as a three dimensional crosspoint memory device, other byte addressable nonvolatile memory devices. A memory device can include a nonvolatile, byte addressable media that stores data based on a resistive state of the memory cell, or based on a phase of the memory cell. In one example, the memory device can use chalcogenide phase change material (e.g., chalcogenide glass). In one example, the memory device can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Memory controller 720 represents one or more memory controller circuits or devices for system 700. Memory controller 720 represents control logic that generates memory access commands in response to the execution of operations by processor 710. Memory controller 720 accesses one or more memory devices 740. Memory devices 740 can be DRAM devices in accordance with any referred to above. In one example, memory devices 740 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one example, settings for each channel are controlled by separate mode registers or other register settings. In one example, each memory controller 720 manages a separate memory channel, although system 700 can be configured to have multiple channels managed by a single controller, or to have multiple controllers on a single channel. In one example, memory controller 720 is part of host processor 710, such as logic implemented on the same die or implemented in the same package space as the host processor or host processor device.

Memory controller 720 includes I/O interface logic 722 to couple to a memory bus, such as a memory channel as referred to above. I/O interface logic 722 (as well as I/O interface logic 742 of memory device 740) can include pins, pads, connectors, signal lines, traces, or wires, or other hardware to connect the devices, or a combination of these. I/O interface logic 722 can include a hardware interface. As illustrated, I/O interface logic 722 includes at least drivers/transceivers for signal lines. Commonly, wires within an integrated circuit interface couple with a pad, pin, or connector to interface signal lines or traces or other wires between devices. I/O interface logic 722 can include drivers, receivers, transceivers, or termination, or other circuitry or combinations of circuitry to exchange signals on the signal lines between the devices. The exchange of signals includes at least one of transmit or receive. While shown as coupling I/O 722 from memory controller 720 to I/O 742 of memory device 740, it will be understood that in an implementation of system 700 where groups of memory devices 740 are accessed in parallel, multiple memory devices can include I/O interfaces to the same interface of memory controller 720. In an implementation of system 700 including one or more memory modules 770, I/O 742 can include interface hardware of the memory module in addition to interface hardware on the memory device itself. Other memory controllers 720 will include separate interfaces to other memory devices 740.

The bus between memory controller 720 and memory devices 740 can be implemented as multiple signal lines coupling memory controller 720 to memory devices 740. The bus may typically include at least clock (CLK) 732, command/address (CMD) 734, and write data (DQ) and read data (DQ) 736, and zero or more other signal lines 738. In one example, a bus or connection between memory controller 720 and memory can be referred to as a memory bus. In one example, the memory bus is a multi-drop bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one example, independent channels have different clock signals, C/A buses, data buses, and other signal lines. Thus, system 700 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 720 and memory devices 740. An example of a serial bus technology is 8B10B encoding and transmission of high-speed data with embedded clock over a single differential pair of signals in each direction. In one example, CMD 734 represents signal lines shared in parallel with multiple memory devices. In one example, multiple memory devices share encoding command signal lines of CMD 734, and each has a separate chip select (CS_n) signal line to select individual memory devices.

It will be understood that in the example of system 700, the bus between memory controller 720 and memory devices 740 includes a subsidiary command bus CMD 734 and a subsidiary bus to carry the write and read data, DQ 736. In one example, the data bus can include bidirectional lines for read data and for write/command data. In another example, the subsidiary bus DQ 736 can include unidirectional write signal lines for write and data from the host to memory, and can include unidirectional lines for read data from the memory to the host. In accordance with the chosen memory technology and system design, other signals 738 may accompany a bus or sub bus, such as strobe lines DQS. Based on design of system 700, or implementation if a design supports multiple implementations, the data bus can have more or less bandwidth per memory device 740. For example, the data bus can support memory devices that have either a x4 interface, a x8 interface, a x16 interface, or other interface. The convention "xW," where W is an integer that refers to an interface size or width of the interface of memory device 740, which represents a number of signal lines to exchange data with memory controller 720. The interface size of the memory devices is a controlling factor on how many memory devices can be used concurrently per channel in system 700 or coupled in parallel to the same signal lines. In one example, high bandwidth memory devices, wide interface devices, or stacked memory configurations, or combinations, can enable wider interfaces, such as a x128 interface, a x256 interface, a x512 interface, a x1024 interface, or other data bus interface width.

In one example, memory devices 740 and memory controller 720 exchange data over the data bus in a burst, or a sequence of consecutive data transfers. The burst corresponds to a number of transfer cycles, which is related to a bus frequency. In one example, the transfer cycle can be a whole clock cycle for transfers occurring on a same clock or strobe signal edge (e.g., on the rising edge). In one example, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length eight (BL8), and each memory device 740 can transfer data on each UI. Thus, a x8 memory device operating on BL8 can transfer 64 bits of data (8 data signal lines times 8 data bits transferred per line over the burst). It will be understood that this simple example is merely an illustration and is not limiting.

Memory devices 740 represent memory resources for system 700. In one example, each memory device 740 is a separate memory die. In one example, each memory device 740 can interface with multiple (e.g., 2) channels per device or die. Each memory device 740 includes I/O interface logic 742, which has a bandwidth determined by the implementation of the device (e.g., x16 or x8 or some other interface bandwidth). I/O interface logic 742 enables the memory devices to interface with memory controller 720. I/O interface logic 742 can include a hardware interface, and can be in accordance with I/O 722 of memory controller, but at the memory device end. In one example, multiple memory devices 740 are connected in parallel to the same command and data buses. In another example, multiple memory devices 740 are connected in parallel to the same command bus, and are connected to different data buses. For example, system 700 can be configured with multiple memory devices 740 coupled in parallel, with each memory device responding to a command, and accessing memory resources 760 internal to each. For a Write operation, an individual memory device 740 can write a portion of the overall data word, and for a Read operation, an individual memory device 740 can fetch a portion of the overall data word. The remaining bits of the word will be provided or received by other memory devices in parallel.

In one example, memory devices 740 are disposed directly on a motherboard or host system platform (e.g., a PCB (printed circuit board) on which processor 710 is disposed) of a computing device. In one example, memory devices 740 can be organized into memory modules 770. In one example, memory modules 770 represent dual inline memory modules (DIMMs). In one example, memory modules 770 represent other organization of multiple memory devices to share at least a portion of access or control circuitry, which can be a separate circuit, a separate device, or a separate board from the host system platform. Memory modules 770 can include multiple memory devices 740, and the memory modules can include support for multiple separate channels to the included memory devices disposed on them. In another example, memory devices 740 may be incorporated into the same package as memory controller 720, such as by techniques such as multi-chip-module (MCM), package-on-package, through-silicon via (TSV), or other techniques or combinations. Similarly, in one example, multiple memory devices 740 may be incorporated into memory modules 770, which themselves may be incorporated into the same package as memory controller 720. It will be appreciated that for these and other implementations, memory controller 720 may be part of host processor 710.

Memory devices 740 each include one or more memory arrays 760. Memory array 760 represents addressable memory locations or storage locations for data. Typically, memory array 760 is managed as rows of data, accessed via wordline (rows) and bitline (individual bits within a row) control. Memory array 760 can be organized as separate channels, ranks, and banks of memory. Channels may refer to independent control paths to storage locations within memory devices 740. Ranks may refer to common locations across multiple memory devices (e.g., same row addresses within different devices) in parallel. Banks may refer to sub-arrays of memory locations within a memory device 740. In one example, banks of memory are divided into sub-banks with at least a portion of shared circuitry (e.g., drivers, signal lines, control logic) for the sub-banks, allowing separate addressing and access. It will be understood that channels, ranks, banks, sub-banks, bank groups, or other organizations of the memory locations, and combinations of the organizations, can overlap in their application to physical resources. For example, the same physical memory locations can be accessed over a specific channel as a specific bank, which can also belong to a rank. Thus, the organization of memory resources will be understood in an inclusive, rather than exclusive, manner.

In one example, memory devices 740 include one or more registers 746. Register 746 represents one or more storage devices or storage locations that provide configuration or settings for the operation of the memory device. In one example, register 746 can provide a storage location for memory device 740 to store data for access by memory controller 720 as part of a control or management operation. In one example, register 746 includes one or more Mode Registers. In one example, register 746 includes one or more multipurpose registers. The configuration of locations within register 746 can configure memory device 740 to operate in different "modes," where command information can trigger different operations within memory device 740 based on the mode. Additionally or in the alternative, different modes can also trigger different operation from address information or other signal lines depending on the mode. Settings of register 746 can indicate configuration for I/O settings (e.g., timing, termination or ODT (on-die termination) 744, driver configuration, or other I/O settings).

In one example, memory device 740 includes ODT 744 as part of the interface hardware associated with I/O 742. ODT 744 can be configured as mentioned above, and provide settings for impedance to be applied to the interface to specified signal lines. In one example, ODT 744 is applied to DQ signal lines. In one example, ODT 744 is applied to command signal lines. In one example, ODT 744 is applied to address signal lines. In one example, ODT 744 can be applied to any combination of the preceding. The ODT settings can be changed based on whether a memory device is a selected target of an access operation or a non-target device. ODT 744 settings can affect the timing and reflections of signaling on the terminated lines. Careful control over ODT 744 can enable higher-speed operation with improved matching of applied impedance and loading. ODT 744 can be applied to specific signal lines of I/O interface 742, 722 (for example, ODT for DQ lines or ODT for CA lines), and is not necessarily applied to all signal lines.

Memory device 740 includes controller 750, which represents control logic within the memory device to control internal operations within the memory device. For example, controller 750 decodes commands sent by memory controller 720 and generates internal operations to execute or satisfy the commands. Controller 750 can be referred to as an internal controller, and is separate from memory controller 720 of the host. Controller 750 can determine what mode is selected based on register 746, and configure the internal execution of operations for access to memory resources 760 or other operations based on the selected mode. Controller 750 generates control signals to control the routing of bits within memory device 740 to provide a proper interface for the selected mode and direct a command to the proper memory locations or addresses. Controller 750 includes command logic 752, which can decode command encoding received on command and address signal lines. Thus, command logic 752 can be or include a command decoder. With command logic 752, memory device can identify commands and generate internal operations to execute requested commands.

Referring again to memory controller 720, memory controller 720 includes command (CMD) logic 724, which represents logic or circuitry to generate commands to send to memory devices 740. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 740, memory controller 720 can issue commands via I/O 722 to cause memory device 740 to execute the commands. In one example, controller 750 of memory device 740 receives and decodes command and address information received via I/O 742 from memory controller 720. Based on the received command and address information, controller 750 can control the timing of operations of the logic and circuitry within memory device 740 to execute the commands. Controller 750 is responsible for compliance with standards or specifications within memory device 740, such as timing and signaling requirements. Memory controller 720 can implement compliance with standards or specifications by access scheduling and control.

Memory controller 720 includes scheduler 730, which represents logic or circuitry to generate and order transactions to send to memory device 740. From one perspective, the primary function of memory controller 720 could be said to schedule memory access and other transactions to memory device 740. Such scheduling can include generating the transactions themselves to implement the requests for data by processor 710 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 720 typically includes logic such as scheduler 730 to allow selection and ordering of transactions to improve performance of system 700. Thus, memory controller 720 can select which of the outstanding transactions should be sent to memory device 740 in which order, which is typically achieved with logic much more complex that a simple first-in first-out algorithm. Memory controller 720 manages the transmission of the transactions to memory device 740, and manages the timing associated with the transaction. In one example, transactions have deterministic timing, which can be managed by memory controller 720 and used in determining how to schedule the transactions with scheduler 730.

In one example, memory controller 720 includes refresh (REF) logic 726. Refresh logic 726 can be used for memory resources that are volatile and need to be refreshed to retain a deterministic state. In one example, refresh logic 726 indicates a location for refresh, and a type of refresh to perform. Refresh logic 726 can trigger self-refresh within memory device 740, or execute external refreshes which can be referred to as auto refresh commands) by sending refresh commands, or a combination. In one example, controller 750 within memory device 740 includes refresh logic 754 to apply refresh within memory device 740. In one example, refresh logic 754 generates internal operations to perform refresh in accordance with an external refresh received from memory controller 720. Refresh logic 754 can determine if a refresh is directed to memory device 740, and what memory resources 760 to refresh in response to the command.

Figure 8:
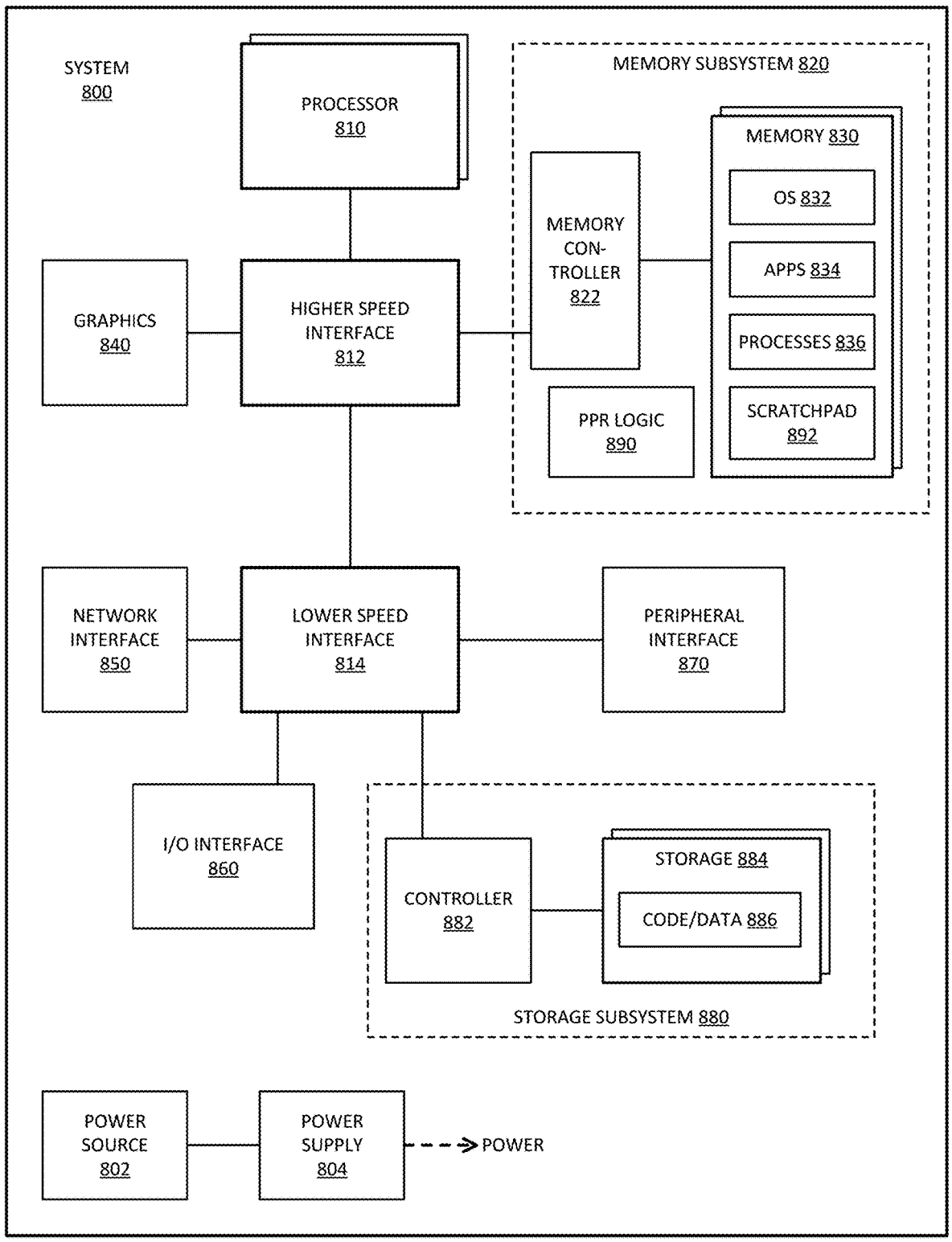
FIG. 8 is a block diagram of an example of a computing system in which PPR in a memory with an internal scratchpad memory can be implemented.

FIG. 8 is a block diagram of an example of a computing system in which PPR in a memory with an internal scratchpad memory can be implemented. System 800 represents a computing device in accordance with any example herein, and can be a laptop computer, a desktop computer, a tablet computer, a server, a gaming or entertainment control system, embedded computing device, or other electronic device. System 800 provides an example of a system in accordance with system 100 or system 300.

In one example, system 800 includes an internal scratchpad memory 892 in memory 830. Scratchpad 892 enables memory 830 to perform PPR with internal storage without having to move data contents of a failure row to memory controller 822. In one example, memory subsystem 820 includes PPR logic 890 to perform PPR operations to support remapping a failure row with scratchpad 892. In one example, PPR logic 890 is included at least in part in memory controller 822. In one example, PPR logic 890 is included at least in part in memory 830. PPR logic 890 enables memory subsystem 820 to execute operations to remap a failure row, moving the data contents of the failure row to the new row with scratchpad 892 in accordance with any example herein.

System 800 includes processor 810 can include any type of microprocessor, central processing unit (CPU), graphics processing unit (GPU), processing core, or other processing hardware, or a combination, to provide processing or execution of instructions for system 800. Processor 810 controls the overall operation of system 800, and can be or include, one or more programmable general-purpose or special-purpose microprocessors, digital signal processors (DSPs), programmable controllers, application specific integrated circuits (ASICs), programmable logic devices (PLDs), or a combination of such devices.

In one example, system 800 includes interface 812 coupled to processor 810, which can represent a higher speed interface or a high throughput interface for system components that need higher bandwidth connections, such as memory subsystem 820 or graphics interface components 840. Interface 812 represents an interface circuit, which can be a standalone component or integrated onto a processor die. Interface 812 can be integrated as a circuit onto the processor die or integrated as a component on a system on a chip. Where present, graphics interface 840 interfaces to graphics components for providing a visual display to a user of system 800. Graphics interface 840 can be a standalone component or integrated onto the processor die or system on a chip. In one example, graphics interface 840 can drive a high definition (HD) display or ultra high definition (UHD) display that provides an output to a user. In one example, the display can include a touchscreen display. In one example, graphics interface 840 generates a display based on data stored in memory 830 or based on operations executed by processor 810 or both.

Memory subsystem 820 represents the main memory of system 800, and provides storage for code to be executed by processor 810, or data values to be used in executing a routine. Memory subsystem 820 can include one or more memory devices 830 such as read-only memory (ROM), flash memory, one or more varieties of random access memory (RAM) such as DRAM, 3DXP (three-dimensional crosspoint), or other memory devices, or a combination of such devices. Memory 830 stores and hosts, among other things, operating system (OS) 832 to provide a software platform for execution of instructions in system 800. Additionally, applications 834 can execute on the software platform of OS 832 from memory 830. Applications 834 represent programs that have their own operational logic to perform execution of one or more functions. Processes 836 represent agents or routines that provide auxiliary functions to OS 832 or one or more applications 834 or a combination. OS 832, applications 834, and processes 836 provide software logic to provide functions for system 800. In one example, memory subsystem 820 includes memory controller 822, which is a memory controller to generate and issue commands to memory 830. It will be understood that memory controller 822 could be a physical part of processor 810 or a physical part of interface 812. For example, memory controller 822 can be an integrated memory controller, integrated onto a circuit with processor 810, such as integrated onto the processor die or a system on a chip.

While not specifically illustrated, it will be understood that system 800 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 800 includes interface 814, which can be coupled to interface 812. Interface 814 can be a lower speed interface than interface 812. In one example, interface 814 represents an interface circuit, which can include stand-alone components and integrated circuitry. In one example, multiple user interface components or peripheral components, or both, couple to interface 814. Network interface 850 provides system 800 the ability to communicate with remote devices (e.g., servers or other computing devices) over one or more networks. Network interface 850 can include an Ethernet adapter, wireless interconnection components, cellular network interconnection components, USB (universal serial bus), or other wired or wireless standards-based or proprietary interfaces. Network interface 850 can exchange data with a remote device, which can include sending data stored in memory or receiving data to be stored in memory.

In one example, system 800 includes one or more input/output (I/O) interface(s) 860. I/O interface 860 can include one or more interface components through which a user interacts with system 800 (e.g., audio, alphanumeric, tactile/touch, or other interfacing). Peripheral interface 870 can include any hardware interface not specifically mentioned above. Peripherals refer generally to devices that connect dependently to system 800. A dependent connection is one where system 800 provides the software platform or hardware platform or both on which operation executes, and with which a user interacts.

In one example, system 800 includes storage subsystem 880 to store data in a nonvolatile manner. In one example, in certain system implementations, at least certain components of storage 880 can overlap with components of memory subsystem 820. Storage subsystem 880 includes storage device(s) 884, which can be or include any conventional medium for storing large amounts of data in a nonvolatile manner, such as one or more magnetic, solid state, 3DXP, or optical based disks, or a combination. Storage 884 holds code or instructions and data 886 in a persistent state (i.e., the value is retained despite interruption of power to system 800). Storage 884 can be generically considered to be a "memory," although memory 830 is typically the executing or operating memory to provide instructions to processor 810. Whereas storage 884 is nonvolatile, memory 830 can include volatile memory (i.e., the value or state of the data is indeterminate if power is interrupted to system 800). In one example, storage subsystem 880 includes controller 882 to interface with storage 884. In one example controller 882 is a physical part of interface 814 or processor 810, or can include circuits or logic in both processor 810 and interface 814.

Power source 802 provides power to the components of system 800. More specifically, power source 802 typically interfaces to one or multiple power supplies 804 in system 800 to provide power to the components of system 800. In one example, power supply 804 includes an AC to DC (alternating current to direct current) adapter to plug into a wall outlet. Such AC power can be renewable energy (e.g., solar power) power source 802. In one example, power source 802 includes a DC power source, such as an external AC to DC converter. In one example, power source 802 or power supply 804 includes wireless charging hardware to charge via proximity to a charging field. In one example, power source 802 can include an internal battery or fuel cell source.

Figure 9:
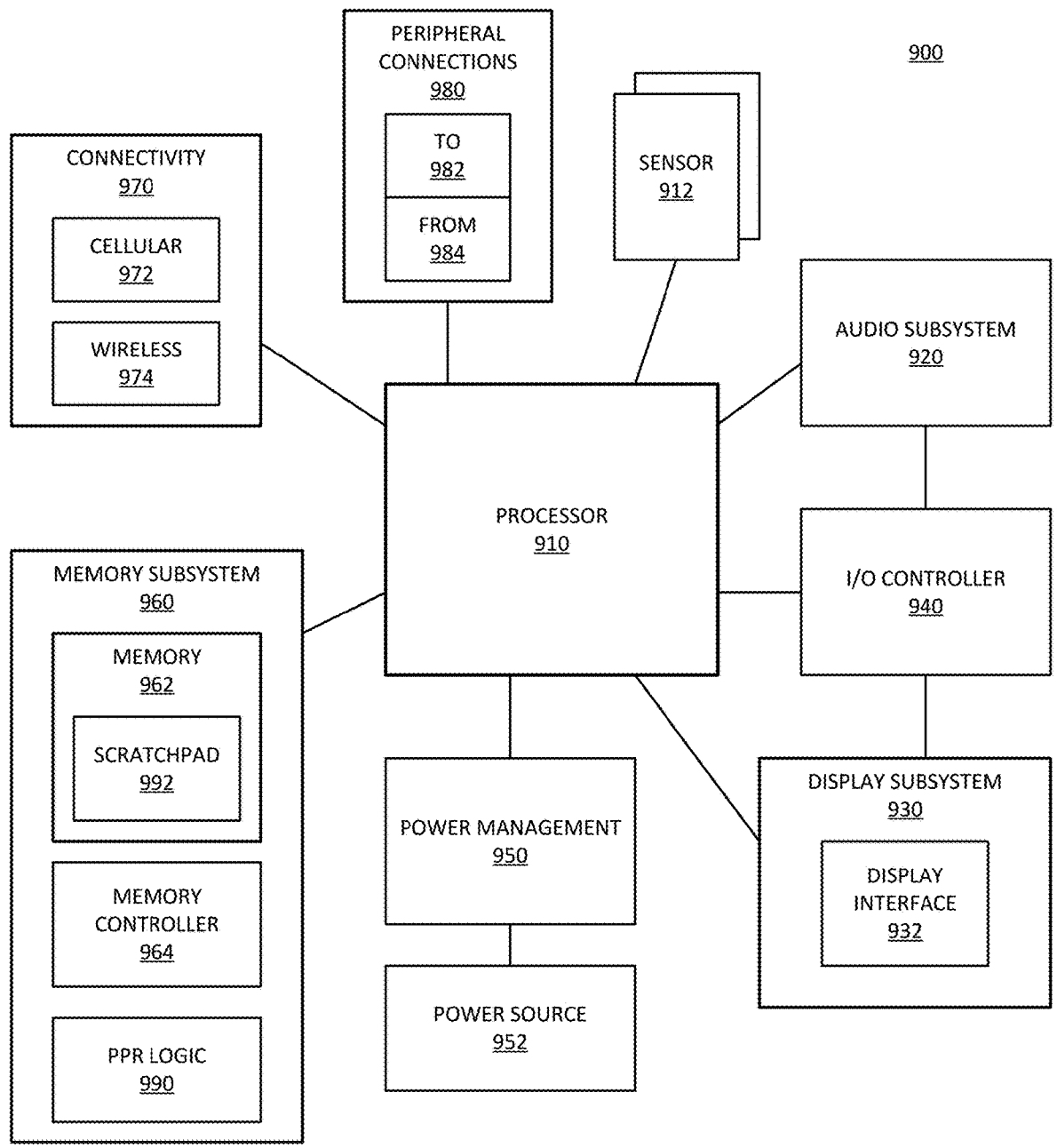
FIG. 9 is a block diagram of an example of a mobile device in which PPR in a memory with an internal scratchpad memory can be implemented.

FIG. 9 is a block diagram of an example of a mobile device in which PPR in a memory with an internal scratchpad memory can be implemented. System 900 represents a mobile computing device, such as a computing tablet, a mobile phone or smartphone, wearable computing device, or other mobile device, or an embedded computing device. It will be understood that certain of the components are shown generally, and not all components of such a device are shown in system 900. System 900 provides an example of a system in accordance with system 100 or system 300.

In one example, system 900 includes an internal scratchpad memory 992 in memory 962. Scratchpad 992 enables memory 962 to perform PPR with internal storage without having to move data contents of a failure row to memory controller 964. In one example, memory subsystem 960 includes PPR logic 990 to perform PPR operations to support remapping a failure row with scratchpad 992. In one example, PPR logic 990 is included at least in part in memory controller 964. In one example, PPR logic 990 is included at least in part in memory 962. PPR logic 990 enables memory subsystem 960 to execute operations to remap a failure row, moving the data contents of the failure row to the new row with scratchpad 992 in accordance with any example herein.

System 900 includes processor 910, which performs the primary processing operations of system 900. Processor 910 can include one or more physical devices, such as microprocessors, application processors, microcontrollers, programmable logic devices, or other processing means. The processing operations performed by processor 910 include the execution of an operating platform or operating system on which applications and device functions are executed. The processing operations include operations related to I/O (input/output) with a human user or with other devices, operations related to power management, operations related to connecting system 900 to another device, or a combination. The processing operations can also include operations related to audio I/O, display I/O, or other interfacing, or a combination. Processor 910 can execute data stored in memory. Processor 910 can write or edit data stored in memory.

In one example, system 900 includes one or more sensors 912. Sensors 912 represent embedded sensors or interfaces to external sensors, or a combination. Sensors 912 enable system 900 to monitor or detect one or more conditions of an environment or a device in which system 900 is implemented. Sensors 912 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 912 can also include sensors for biometric systems such as fingerprint recognition systems, face detection or recognition systems, or other systems that detect or recognize user features. Sensors 912 should be understood broadly, and not limiting on the many different types of sensors that could be implemented with system 900.

In one example, one or more sensors 912 couples to processor 910 via a frontend circuit integrated with processor 910. In one example, one or more sensors 912 couples to processor 910 via another component of system 900.

In one example, system 900 includes audio subsystem 920, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into system 900, or connected to system 900. In one example, a user interacts with system 900 by providing audio commands that are received and processed by processor 910.

Display subsystem 930 represents hardware (e.g., display devices) and software components (e.g., drivers) that provide a visual display for presentation to a user. In one example, the display includes tactile components or touchscreen elements for a user to interact with the computing device. Display subsystem 930 includes display interface 932, which includes the particular screen or hardware device used to provide a display to a user. In one example, display interface 932 includes logic separate from processor 910 (such as a graphics processor) to perform at least some processing related to the display. In one example, display subsystem 930 includes a touchscreen device that provides both output and input to a user. In one example, display subsystem 930 includes a high definition (HD) or ultra-high definition (UHD) display that provides an output to a user. In one example, display subsystem includes or drives a touchscreen display. In one example, display subsystem 930 generates display information based on data stored in memory or based on operations executed by processor 910 or both.

I/O controller 940 represents hardware devices and software components related to interaction with a user. I/O controller 940 can operate to manage hardware that is part of audio subsystem 920, or display subsystem 930, or both. Additionally, I/O controller 940 illustrates a connection point for additional devices that connect to system 900 through which a user might interact with the system. For example, devices that can be attached to system 900 might include microphone devices, speaker or stereo systems, video systems or other display device, keyboard or keypad devices, buttons/switches, or other I/O devices for use with specific applications such as card readers or other devices.

As mentioned above, I/O controller 940 can interact with audio subsystem 920 or display subsystem 930 or both. For example, input through a microphone or other audio device can provide input or commands for one or more applications or functions of system 900. Additionally, audio output can be provided instead of or in addition to display output. In another example, if display subsystem includes a touchscreen, the display device also acts as an input device, which can be at least partially managed by I/O controller 940. There can also be additional buttons or switches on system 900 to provide I/O functions managed by I/O controller 940.

In one example, I/O controller 940 manages devices such as accelerometers, cameras, light sensors or other environmental sensors, gyroscopes, global positioning system (GPS), or other hardware that can be included in system 900, or sensors 912. The input can be part of direct user interaction, as well as providing environmental input to the system to influence its operations (such as filtering for noise, adjusting displays for brightness detection, applying a flash for a camera, or other features).

In one example, system 900 includes power management 950 that manages battery power usage, charging of the battery, and features related to power saving operation. Power management 950 manages power from power source 952, which provides power to the components of system 900. In one example, power source 952 includes an AC to DC (alternating current to direct current) adapter to plug into a wall outlet. Such AC power can be renewable energy (e.g., solar power, motion based power). In one example, power source 952 includes only DC power, which can be provided by a DC power source, such as an external AC to DC converter. In one example, power source 952 includes wireless charging hardware to charge via proximity to a charging field. In one example, power source 952 can include an internal battery or fuel cell source.

Memory subsystem 960 includes memory device(s) 962 for storing information in system 900. Memory subsystem 960 can include nonvolatile (state does not change if power to the memory device is interrupted) or volatile (state is indeterminate if power to the memory device is interrupted) memory devices, or a combination. Memory 960 can store application data, user data, music, photos, documents, or other data, as well as system data (whether long-term or temporary) related to the execution of the applications and functions of system 900. In one example, memory subsystem 960 includes memory controller 964 (which could also be considered part of the control of system 900, and could potentially be considered part of processor 910). Memory controller 964 includes a scheduler to generate and issue commands to control access to memory device 962.

Connectivity 970 includes hardware devices (e.g., wireless or wired connectors and communication hardware, or a combination of wired and wireless hardware) and software components (e.g., drivers, protocol stacks) to enable system 900 to communicate with external devices. The external device could be separate devices, such as other computing devices, wireless access points or base stations, as well as peripherals such as headsets, printers, or other devices. In one example, system 900 exchanges data with an external device for storage in memory or for display on a display device. The exchanged data can include data to be stored in memory, or data already stored in memory, to read, write, or edit data.

Connectivity 970 can include multiple different types of connectivity. To generalize, system 900 is illustrated with cellular connectivity 972 and wireless connectivity 974. Cellular connectivity 972 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), 5G, or other cellular service standards. Wireless connectivity 974 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 980 include hardware interfaces and connectors, as well as software components (e.g., drivers, protocol stacks) to make peripheral connections. It will be understood that system 900 could both be a peripheral device ("to" 982) to other computing devices, as well as have peripheral devices ("from" 984) connected to it. System 900 commonly has a "docking" connector to connect to other computing devices for purposes such as managing (e.g., downloading, uploading, changing, synchronizing) content on system 900. Additionally, a docking connector can allow system 900 to connect to certain peripherals that allow system 900 to control content output, for example, to audiovisual or other systems.

In addition to a proprietary docking connector or other proprietary connection hardware, system 900 can make peripheral connections 980 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

In general with respect to the descriptions herein, in one example a memory device including: a memory array having multiple rows of memory having logical addresses mapped to their physical addresses and at least one spare row not having a logical address mapped to its physical address; and a controller to detect a failure of one of the multiple rows of memory ("failure row") and execute a post package repair (PPR) mode, including: map the logical address of the failure row from a physical address of the failure row to a physical address of the spare row, transfer data contents from the failure row to an internal scratchpad memory internal to the memory device, and transfer the data contents from the internal scratchpad memory to the spare row.

In one example, the PPR mode comprises a soft PPR (sPPR) mode. In one example, the PPR mode comprises a PPR mode in response to a built-in self-test (BIST) of the memory device. In one example, the internal scratchpad memory comprises a prefetch buffer. In one example, the prefetch buffer comprises a sense amplifier circuit. In one example, the internal scratchpad memory comprises an internal register. In one example, the memory array comprises multiple banks of memory; and wherein the internal scratchpad memory comprises an internal scratchpad localized to a single bank of memory. In one example, the transfer of the data contents from the failure row to the internal scratchpad memory is host controlled by a host controller, wherein the host controller is to provide commands to cause the transfer of the data contents to the internal scratchpad memory and from the internal scratchpad memory to the spare row. In one example, the transfer of the data contents from the failure row to the internal scratchpad memory is autonomous, wherein the memory device internally transfers the data contents to the internal scratchpad memory and from the internal scratchpad memory to the spare row, without a host controller associated with the memory device to send commands to transfer the data contents. In one example, the memory device comprises a synchronous dynamic random access memory (SDRAM) device compatible with a double data rate (DDR) standard.

In general with respect to the descriptions herein, in one example a system includes: a memory controller; a dynamic random access memory (DRAM) device coupled to the memory controller, the DRAM device including a memory array having multiple rows of memory having logical addresses mapped to their physical addresses and at least one spare row not having a logical address mapped to its physical address; and a controller to detect a failure of one of the multiple rows of memory ("failure row") and execute a post package repair (PPR) mode, including: map the logical address of the failure row from the physical address of the failure row to the physical address of the spare row, transfer data contents from the failure row to an internal scratchpad memory internal to the memory device, and transfer the data contents from the internal scratchpad memory to the spare row.

In one example, the PPR mode comprises a soft PPR (sPPR) mode. In one example, the internal scratchpad memory comprises a prefetch buffer. In one example, the prefetch buffer comprises a sense amplifier circuit. In one example, the internal scratchpad memory comprises an internal register. In one example, the controller is internal to the memory device. In one example, the memory array comprises multiple banks of memory; and wherein the internal scratchpad memory comprises an internal scratchpad localized to a single bank of memory. In one example, the transfer of the data contents from the failure row to the internal scratchpad memory is host controlled by the memory controller, wherein the memory controller is to provide commands to cause the transfer of the data contents to the internal scratchpad memory and from the internal scratchpad memory to the spare row. In one example, the transfer of the data contents from the failure row to the internal scratchpad memory is autonomous, wherein the memory device internally transfers the data contents to the internal scratchpad memory and from the internal scratchpad memory to the spare row, without the memory controller associated with the memory device to send commands to transfer the data contents. In one example, the system further includes one or more of: a host processor device coupled to the memory controller; a display communicatively coupled to a host processor; a network interface communicatively coupled to a host processor; or a battery to power the system.

In general with respect to the descriptions herein, in one example a method includes: detecting a failure of one of multiple rows of memory ("failure row") of a memory array having multiple rows of memory having logical addresses mapped to their physical addresses and at least one spare row not having a logical address mapped to its physical address; and executing a post package repair (PPR) mode, including: mapping the logical address of the failure row from a physical address of the failure row to a physical address of the spare row; transferring data contents from the failure row to an internal scratchpad memory internal to the memory device; and transferring the data contents from the internal scratchpad memory to the spare row.

In one example, the PPR mode comprises a soft PPR (sPPR) mode. In one example, the PPR mode comprises a PPR mode in response to a built-in self-test (GIST) of the memory device. In one example, the internal scratchpad memory comprises a prefetch buffer. In one example, the prefetch buffer comprises a sense amplifier circuit. In one example, the internal scratchpad memory comprises an internal register. In one example, the memory array comprises multiple banks of memory; and wherein the internal scratchpad memory comprises an internal scratchpad localized to a single bank of memory. In one example, the transfer of the data contents from the failure row to the internal scratchpad memory is host controlled by a host controller, wherein the host controller is to provide commands to cause the transfer of the data contents to the internal scratchpad memory and from the internal scratchpad memory to the spare row. In one example, the transfer of the data contents from the failure row to the internal scratchpad memory is autonomous, wherein the memory device internally transfers the data contents to the internal scratchpad memory and from the internal scratchpad memory to the spare row, without a host controller associated with the memory device to send commands to transfer the data contents. In one example, the memory device comprises a synchronous dynamic random access memory (SDRAM) device compatible with a double data rate (DDR) standard.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory device comprising:
a memory array having multiple rows of memory, including a failure row detected to have a failure;
an internal scratchpad memory internal to the memory device; and
an internal controller of the memory device to receive an address of the failure row from a host controller, the internal controller to execute a post package repair (PPR) mode, including:
map a logical address of the failure row from a physical address of the failure row to a physical address of a spare row,
transfer data contents from the failure row to the internal scratchpad memory without transferring the data contents to the host controller, and
transfer the data contents from the internal scratchpad memory to the spare row.

2. The memory device of claim 1, wherein the PPR mode comprises a soft PPR (sPPR) mode.

3. The memory device of claim 1, wherein the PPR mode comprises a PPR mode in response to a built-in self-test (GIST) of the memory device.

4. The memory device of claim 1, wherein the internal scratchpad memory comprises a prefetch buffer.

5. The memory device of claim 4, wherein the prefetch buffer comprises a sense amplifier circuit.

6. The memory device of claim 1, wherein the internal scratchpad memory comprises an internal register.

7. The memory device of claim 1, wherein the memory array comprises multiple banks of memory; and wherein the internal scratchpad memory comprises an internal scratchpad localized to a single bank of memory.

8. The memory device of claim 1, wherein the transfer of the data contents from the failure row to the internal scratchpad memory is host controlled by a host controller, wherein the host controller is to provide commands to cause the transfer of the data contents to the internal scratchpad memory and from the internal scratchpad memory to the spare row.

9. The memory device of claim 1, wherein the transfer of the data contents from the failure row to the internal scratchpad memory is autonomous, wherein the memory device internally transfers the data contents to the internal scratchpad memory and from the internal scratchpad memory to the spare row, without a host controller associated with the memory device to send commands to transfer the data contents.

10. The memory device of claim 1, wherein the memory device comprises a synchronous dynamic random access memory (SDRAM) device compatible with a double data rate (DDR) standard.

11. A system, comprising:
a memory controller;
a dynamic random access memory (DRAM) device coupled to the memory controller, the DRAM device including a memory array having multiple rows of memory, including a failure row detected to have a failure; and
a controller separate from the memory controller, to receive an address of the failure row from the memory controller, the controller to execute a post package repair (PPR) mode, including: map a logical address of the failure row from a physical address of the failure row to a physical address of a spare row, transfer data contents from the failure row to an internal scratchpad memory internal to the DRAM device without transferring the data contents to the memory controller, and transfer the data contents from the internal scratchpad memory to the spare row.

12. The system of claim 11, wherein the PPR mode comprises a soft PPR (sPPR) mode.

13. The system of claim 11, wherein the internal scratchpad memory comprises a prefetch buffer.

14. The system of claim 13, wherein the prefetch buffer comprises a sense amplifier circuit.

15. The system of claim 11, wherein the internal scratchpad memory comprises an internal register.

16. The system of claim 11, wherein the controller is internal to the DRAM device.

17. The system of claim 11, wherein the memory array comprises multiple banks of memory; and wherein the internal scratchpad memory comprises an internal scratchpad localized to a single bank of memory.

18. The system of claim 11, wherein the transfer of the data contents from the failure row to the internal scratchpad memory is host controlled by the memory controller, wherein the memory controller is to provide commands to cause the transfer of the data contents to the internal scratchpad memory and from the internal scratchpad memory to the spare row.

19. The system of claim 11, wherein the transfer of the data contents from the failure row to the internal scratchpad memory is autonomous, wherein the DRAM device internally transfers the data contents to the internal scratchpad memory and from the internal scratchpad memory to the spare row, without the memory controller associated with the DRAM device to send commands to transfer the data contents.

20. The system of claim 11, further comprising one or more of:
- a host processor device coupled to the memory controller;
- a display communicatively coupled to a host processor;
- a network interface communicatively coupled to a host processor; or
- a battery to power the system.

\* \* \* \* \*

UNITED STATES PATENT AND TRADEMARK OFFICE
CERTIFICATE OF CORRECTION

PATENT NO. : 11,989,106 B2
APPLICATION NO. : 16/711243
DATED : May 21, 2024
INVENTOR(S) : Jongwon Lee and Kuljit S. Bains It is certified that error appears in the above-identified patent and that said Letters Patent is hereby corrected as shown below:

In the Claims

Column 28, Lines 15-17 Claim 3:
"The memory device of claim 1, wherein the PPR mode comprises a PPR mode in response to a built-in self-test (GIST) of the memory device."

Should read:
The memory device of claim 1, wherein the PPR mode comprises a PPR mode in response to a built-in self-test (BIST) of the memory device.

Signed and Sealed this
Twentieth Day of August, 2024

Katherine Kelly Vidal
*Director of the United States Patent and Trademark Office*